(12) United States Patent
Fujimoto et al.

(10) Patent No.: US 7,653,104 B2
(45) Date of Patent: Jan. 26, 2010

(54) SEMICONDUCTOR LASER DEVICE

(75) Inventors: Yasuhiro Fujimoto, Okayama (JP);
Tougo Nakatani, Hyogo (JP); Toru Takayama, Hyogo (JP); Isao Kidoguchi, Hyogo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/246,859

(22) Filed: Oct. 7, 2008

(65) Prior Publication Data

US 2009/0180504 A1   Jul. 16, 2009

(30) Foreign Application Priority Data

Jan. 10, 2008   (JP) .............................. 2008-003013

(51) Int. Cl.
*H01S 5/00* (2006.01)
(52) U.S. Cl. ............................... 372/45.011; 372/50.12
(58) Field of Classification Search ............ 372/45.011, 372/50.12
See application file for complete search history.

(56) References Cited

U.S. PATENT DOCUMENTS

2005/0281299 A1   12/2005   Hashimoto

2006/0227831 A1   10/2006   Nishida et al.

FOREIGN PATENT DOCUMENTS

| JP | 03-021093 | 1/1991 |
|---|---|---|
| JP | 06-224516 | 8/1994 |
| JP | 2006-012899 | 1/2006 |
| JP | 2006-313875 | 11/2006 |

*Primary Examiner*—Armando Rodriguez
(74) *Attorney, Agent, or Firm*—McDermott Will & Emery LLP

(57) ABSTRACT

A red laser portion and an infrared laser portion are integrated on an n-type GaAs substrate. A p-type cladding layer made of p-type AlGaInP in the red laser portion and a p-type cladding layer made of p-type AlGaInP in the infrared laser portion have a ridge stripe portion having a light emitting point. A current block layer made of $SiN_x$ is formed on both sides of each ridge stripe portion, and a strain relaxing layer made of $ZrO_2$ is selectively formed on an outer side of each ridge stripe region on the current block layer. Provided that Tc is a thermal expansion coefficient of the p-type cladding layers, Tb is a thermal expansion coefficient of the current block layer, and Ts is a thermal expansion coefficient of the strain relaxing layer, the relation of $Tb<Tc<Ts$ is satisfied.

21 Claims, 9 Drawing Sheets

SEMICONDUCTOR LASER DEVICE

CROSS REFERENCE TO RELATED APPLICATION

This application claims priority under 35 U.S.C. §119 on Patent Application No. 2008-3013 filed in Japan on Jan. 10, 2008, the entire contents of which are hereby incorporated by reference.

BACKGROUND OF THE INVENTION

1. Field of the Invention

The present invention relates to a semiconductor laser device. More particularly, the present invention relates to a semiconductor laser device capable of being used as a light source of an optical disc device, an electronic device, an information processor, or the like, and having a plurality of light emitting points on a single substrate.

2. Related Art

High-capacity digital versatile discs (DVDs) capable of high density recording and DVD devices for playing such DVDs have been commercialized and have attracted attention as products of growing demand. Due to the high density recording of the DVDs, an AlGaInP (aluminum gallium indium phosphide)-based semiconductor laser device having an emission wavelength of 650 nm (nanometers) is used as a laser light source for recording and playing the DVDs. A GaN (gallium nitride)-based semiconductor laser device having an emission wavelength of 405 nm has also attracted attention as a semiconductor laser device implementing a significantly improved recording density by reduction in emission wavelength. One of key factors that limit improvement in service life and output power of these visible light band semiconductor laser devices is degradation caused by strains accumulated in an active layer of the semiconductor laser device. Such degradation caused by the strains degrades a polarization property and reliability of the semiconductor laser device because an internal stress is generated by the difference in material and composition between semiconductor layers of the semiconductor laser device and crystal defects are generated in the active layer by the internal stress. In order to prevent such degradation in polarization property and reliability, Japanese Laid-Open Patent Publication No. 2006-012899 (a first conventional example), for example, proposes to form two insulating films on the whole surface of a p-type cladding layer. This publication describes that forming the two insulating films as such relaxes a thermal stress that is applied to the p-type cladding layer, thereby suppressing degradation of a semiconductor laser device.

Moreover, Japanese Laid-Open Patent Publication No. 2006-313875 (a second conventional example), for example, discloses a semiconductor laser device having a red laser element and an infrared laser element integrated on a single substrate. This publication proposes to arrange a light emitting point of light having a predetermined emission wavelength at a position of 15% or less of a chip width from the center line of the chip width according to application in order to reduce a stress that is applied to the light emitting point. This publication describes that the polarization property of the red laser element portion or the infrared laser element portion can be maintained by restricting the position of the light emitting point as such. A "light emitting point" herein indicates a substantial light emitting region which is located under a ridge stripe in an active layer (light emitting layer) of a semiconductor laser structure.

In the first conventional example, two insulating films are formed on the whole surface of the p-type cladding layer in order to relax the thermal stress. In this case, the stress of the laser device itself (the device itself) is relaxed. However, when a laser device having a plurality of light emitting points integrated on a single substrate is mounted on a submount functioning as a heat sink, the laser device is curved due to the difference in thermal expansion coefficient between the submount and the laser device. As a result, the applied stress varies depending on the light emitting point and the asymmetry of the stress is large. It is therefore difficult to simultaneously obtain both reliability and polarization property, causing degradation in yield of the laser device.

In the second conventional example, a light emitting point is arranged at a position in the range of 15% or less of the chip width from the center line of the chip width according to application. The second conventional example makes use of the fact that the stress is small near the center of the chip width. The polarization property can therefore be maintained only for a specific light emitting point. However, when the distance between the light emitting points is restricted to 110 μm (micrometers) as in a two-wavelength semiconductor laser device, one of the light emitting points can be arranged at a position of 15% or less, while the other is arranged at a position of more than 15%. The polarization property of the other light emitting point therefore has to be sacrificed.

SUMMARY OF THE INVENTION

The present invention is made to solve the above conventional problems and it is an object of the present invention to achieve prevention of reduction in reliability and improvement in polarization property by suppressing generation of crystal defects in an active layer and improving asymmetry of a stress that is applied to light emitting points.

In order to achieve the above object, a semiconductor laser device of the present invention is structured as follows: for example, when a semiconductor laser device is mounted p-side down so that a laser structure side having ridge stripes is mounted on a submount, the mounting surface may be convexly or concavely curved with respect to the submount. In the case where the mounting surface is convexly curved with respect to the submount, a strain relaxing layer having a larger thermal expansion coefficient than that of a current block layer is formed only on a region laterally outside each ridge stripe portion. In the case where the mounting surface is concavely curved with respect to the submount, on the other hand, a strain relaxing layer having a smaller thermal expansion coefficient than that of the current block layer is formed only on a region laterally inside each ridge stripe portion. Moreover, in the case where one of the two ridge stripe portions is formed far away from the center line in a width direction of a laser chip, a strain relaxing layer is formed only on both sides of this ridge stripe portion.

More specifically, a first semiconductor laser device according to the present invention includes a first semiconductor laser structure and a second semiconductor laser structure formed on a semiconductor substrate with an isolation groove interposed therebetween. The first semiconductor laser structure has a first ridge stripe portion and the second semiconductor laser structure has a second ridge stripe portion extending in parallel with the first ridge stripe portion. The first semiconductor laser structure has a first cladding layer, a first active layer, a second cladding layer, and a first current block layer which are sequentially formed on the semiconductor substrate. The second semiconductor laser structure has a third cladding layer, a second active layer, a fourth cladding layer, and a second current block layer which are sequentially formed on the semiconductor substrate with the isolation groove interposed between the first semiconductor laser structure and the second semiconductor laser structure. A first strain relaxing layer is formed on a side surface of, and on a region located on a side of, the first ridge stripe portion of the second cladding layer on an opposite side to the second semiconductor laser structure. A second strain relaxing layer is formed on a side surface of, and on a region located on a side of, the second ridge stripe portion of the fourth cladding layer on an opposite side to the first semiconductor laser structure. Provided that Tc is a thermal expansion coefficient of the second cladding layer and the fourth cladding layer, Tb is a thermal expansion coefficient of the first current block layer and the second current block layer, and Ts is a thermal expansion coefficient of the first strain relaxing layer and the second strain relaxing layer, a relation of Tb<Tc<Ts is satisfied.

A second semiconductor laser device according to the present invention includes a first semiconductor laser structure and a second semiconductor laser structure formed on a semiconductor substrate with an isolation groove interposed therebetween. The first semiconductor laser structure has a first ridge stripe portion and the second semiconductor laser structure has a second ridge stripe portion extending in parallel with the first ridge stripe portion. The first semiconductor laser structure has a first cladding layer, a first active layer, a second cladding layer, and a first current block layer which are sequentially formed on the semiconductor substrate. The second semiconductor laser structure has a third cladding layer, a second active layer, a fourth cladding layer, and a second current block layer which are sequentially formed on the semiconductor substrate with the isolation groove interposed between the first semiconductor laser structure and the second semiconductor laser structure. A first strain relaxing layer is formed on a side surface of, and on a region located on a side of, the first ridge stripe portion of the second cladding layer on a side facing the second semiconductor laser structure. A second strain relaxing layer is formed on a side surface of, and on a region located on a side of, the second ridge stripe portion of the fourth cladding layer on a side facing the first semiconductor laser structure. Provided that Tc is a thermal expansion coefficient of the second cladding layer and the fourth cladding layer, Tb is a thermal expansion coefficient of the first current block layer and the second current block layer, and Ts is a thermal expansion coefficient of the first strain relaxing layer and the second strain relaxing layer, a relation of Ts<Tc<Tb is satisfied.

A third semiconductor laser device according to the present invention includes a first semiconductor laser structure and a second semiconductor laser structure formed on a semiconductor substrate with an isolation groove interposed therebetween. The first semiconductor laser structure has a first ridge stripe portion and the second semiconductor laser structure has a second ridge stripe portion extending in parallel with the first ridge stripe portion. The first semiconductor laser structure has a first cladding layer, a first active layer, a second cladding layer, and a first current block layer which are sequentially formed on the semiconductor substrate. The second semiconductor laser structure has a third cladding layer, a second active layer, a fourth cladding layer, and a second current block layer which are sequentially formed on the semiconductor substrate with the isolation groove interposed between the first semiconductor laser structure and the second semiconductor laser structure. A strain relaxing layer is formed on both side surfaces of, and on a region on both sides of, the first ridge stripe portion of the second cladding layer. Provided that Tc is a thermal expansion coefficient of the second cladding layer, Tb is a thermal expansion coefficient of the first current block layer, and Ts is a thermal expansion coefficient of the strain relaxing layer, a relation of Tb<Tc<Ts is satisfied.

According to the first to third semiconductor laser devices, left-right asymmetry of the stress that is applied to each ridge stripe portion can be improved even in a so-called two-wavelength (multi-wavelength) laser device in which the first and second ridge stripe portions (light emitting points) are displaced (offset) from the center line in the width direction of the chip. Generation of crystal defects due to the strain applied locally to each ridge stripe portion can therefore be suppressed. As a result, both high reliability and excellent polarization property of the first semiconductor laser structure and the second semiconductor laser structure can thus be ensured. According to the present invention, the strain relaxing layer is selectively provided in a region that is subjected to a large stress on the current cladding layer. As a result, not only the stress that is applied to the laser device itself but the stress that is applied when the laser device is mounted in a p-side down manner on a submount can be suppressed.

In general, the stress that is applied to the light emitting point of each laser structure increases as the distance from the center of the chip width increases. Therefore, the stress that is applied from both sides to the light emitting point located away from the chip center is asymmetric. For example, when a light emitting point is located far away from the chip center to the right, a large stress is applied to the right side of the ridge stripe portion of the light emitting point. Therefore, in the first conventional example in which the strain relaxing layer is provided on the whole surface of the p-type cladding layer of the ridge stripe portion, the stress of the device itself is relaxed. However, when the device is mounted p-side down on a submount, the stress that is applied to the ridge stripe portions of the respective light emitting points of the red laser portion and the infrared laser portion becomes left-right asymmetric due to the difference in thermal expansion coefficient. For example, since the light emitting point of the red laser portion is located far away from the chip center to the right, a large stress is applied to the right side of the ridge stripe portion of the light emitting point. Since the light emitting point of the infrared laser portion is located far away from the chip center to the left, a large stress is applied to the left side of the ridge stripe portion of the light emitting point. Such asymmetry of the stress causes a shearing stress in the semiconductor crystal of the laser structure, whereby a refractive index in the crystal changes into a birefringence. This causes rotation of a polarization plane of light traveling in a longitudinal direction of a cavity, and the polarization property is degraded. Moreover, due to the stress in the crystal, generation of crystal defects in the active layer cannot be suppressed. It is therefore difficult to ensure both reliability and polarization property in the red laser portion and the infrared laser portion, resulting in degradation in yield of the laser device. According to the present invention, the strain relaxing layer is selectively provided in a region subjected to a large stress, whereby reduction of the stress and suppression of asymmetry of the stress can be achieved.

In the first to third semiconductor laser devices, a center line of the isolation groove in an extending direction thereof preferably matches a center line of the semiconductor substrate in a width direction perpendicular to an extending direction of the ridge stripe portions.

In the first to third semiconductor laser devices, a center line of the isolation groove in an extending direction thereof is preferably shifted in parallel from a center line of the semiconductor substrate in a width direction perpendicular to an extending direction of the ridge stripe portions.

In the first or second semiconductor laser device, the first ridge stripe portion and the second ridge stripe portion are preferably formed symmetrically with respect to a center line of the semiconductor substrate in a width direction perpendicular to an extending direction of the ridge stripe portions.

In the first to third semiconductor laser devices, a distance between the first ridge stripe portion and a center line of the semiconductor substrate in a width direction perpendicular to an extending direction of the ridge stripe portions is preferably different from a distance between the second ridge stripe portion and the center line of the semiconductor substrate in the width direction.

In the third semiconductor laser device, a distance between the first ridge stripe portion and a center line of the semiconductor substrate in a width direction perpendicular to an extending direction of the ridge stripe portions is preferably larger than a distance between the second ridge stripe portion and the center line of the semiconductor substrate in the width direction.

In the first or second semiconductor laser device, the first current block layer, the second current block layer, the first strain relaxing layer, and the second strain relaxing layer are preferably made of a material containing silicon nitride, zirconium oxide, aluminum oxide, silicon oxide, or amorphous silicon hydride as a main component.

In the third semiconductor laser device, the first current block layer and the strain relaxing layer are preferably made of a material containing silicon nitride, zirconium oxide, aluminum oxide, silicon oxide, or amorphous silicon hydride as a main component.

In the first or second semiconductor laser device, provided that d1 is a thickness of the first current block layer and the second current block layer and d2 is a thickness of the first strain relaxing layer and the second strain relaxing layer, d1 and d2 are preferably in the following range: 100 nm≦d1≦450 nm and 10 m≦d2≦300 nm.

In the third semiconductor laser device, provided that d1 is a thickness of the first current block layer and d2 is a thickness of the strain relaxing layer, d1 and d2 are preferably in the following range: 100 nm≦d1≦450 nm and 10 nm≦d2≦300 nm.

As has been described above, in the semiconductor laser device of the present invention, a strain relaxing layer having a different thermal expansion coefficient from that of the cladding layer and the current block layer is selectively formed, whereby generation of crystal defects in the active layer can be suppressed, and asymmetry of the stress that is applied to the light emitting point can be suppressed. As a result, both reliability and polarization property can be improved. Even when a semiconductor laser chip having two light emitting points is mounted on a submount serving as a heat sink, curving (curvature) of the laser chip with respect to the submount due to the difference in thermal expansion coefficient between the submount and the semiconductor laser chip can be suppressed. As a result, the polarization property can be assured for the two light emitting points.

DETAILED DESCRIPTION OF THE PREFERRED EMBODIMENTS

First Embodiment

A first embodiment of the present invention will now be described with reference to the accompanying drawings.

Figure 1:
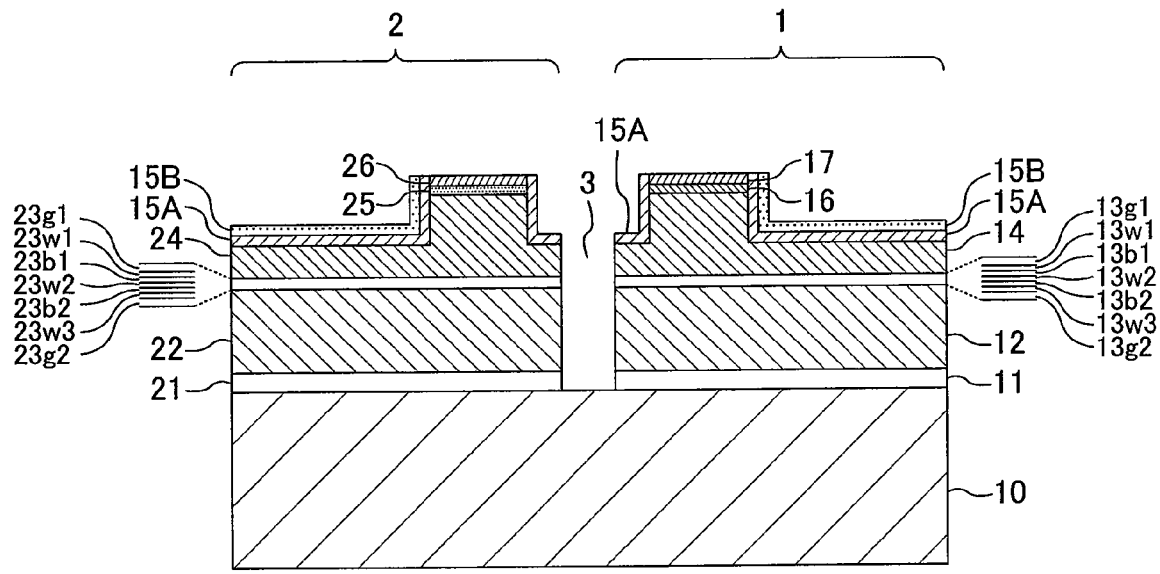
FIG. 1 is a cross-sectional view of a semiconductor laser device according to a first embodiment of the present invention.

FIG. 1 shows a cross-sectional structure of a semiconductor laser device according to the first embodiment of the present invention. As shown in FIG. 1, a red laser portion 1 and an infrared laser portion 2 are electrically isolated from each other by an isolation groove 3 and monolithically integrated on a main surface of a substrate 10. The substrate 10 is made of, for example, n-type GaAs (gallium arsenide). The center line of the isolation groove 3 herein matches the center line in a width direction (the left-right direction in FIG. 1) of a chip. In the first embodiment, the chip width is 250 μm, and a light emitting point of the red laser portion 1 has a displacement rate (based on the chip width) of 19% of the chip width from the center line in the width direction of the chip. A light emitting point of the infrared laser portion 2 has a displacement rate of 25% of the chip width from the center line in the width direction of the chip. Note that the above displacement rates are shown by way of example only, and the red laser portion 1 and the infrared laser portion 2 may have other displacement rates. Alternatively, the red laser portion 1 and the infrared laser portion 2 may have the same displacement rate such as 22% or 20%.

In the red laser portion 1, a buffer layer 11, an n-type cladding layer 12, a strained quantum well active layer 13, a p-type cladding layer 14, a protective layer 16, and a p-type contact layer 17 are sequentially formed by epitaxial growth. The buffer layer 11 is made of n-type GaAs and has a thickness of 500 nm. The n-type cladding layer 12 is made of n-type AlGaInP and has a thickness of 2 μm. The strained quantum well active layer 13 is formed by a first guide layer 13g1 made of AlGaInP, well layers 13w1 through 13w3 made of GaInP (gallium indium phosphide) and barrier layers 13b1, 13b2 made of AlGaInP, and a second guide layer 13g2 made of AlGaInP. The p-type cladding layer 14 is made of p-type AlGaInP. The protective layer 16 is made of p-type GaInP and has a thickness of 50 nm. The p-type contact layer 17 is made of p-type GaAs and has a thickness of 400 nm.

In the p-type cladding layer 14, a first ridge stripe portion (first ridge portion) is formed in parallel with the isolation groove 3. The distance between the top surface of the first ridge portion and the strained quantum well active layer (active layer) 13 is 1.4 μm and the distance (=dp) between the lower end of the first ridge portion and the active layer 13 is 0.2 μm.

A current block layer 15A is formed on both side surfaces and both sides of the first ridge portion in the p-type cladding layer 14. A strain relaxing layer 15B is formed only in a region opposite to the isolation groove 3 on the current block layer 15A. The current block layer 15A is made of $SiN_x$ (silicon nitride) and has a thickness of 200 nm, and the strain relaxing layer 15B is made of $ZrO_2$ (zirconium oxide) and has a thickness of 50 nm. In the red laser portion 1 of the first embodiment, the strain relaxing layer 15B is thus formed only on the outer side of the first ridge portion.

In this structure, a current injected from the p-type contact layer 17 is confined by the first ridge portion due to the current block layer 15A and is therefore injected intensively to the active layer 13 located under the first ridge portion. A population inversion state of carriers required for laser oscillation is thus implemented by an injection current as low as several tens of milliamperes. Light emitted by recombination of the carriers injected to the active layer 13 is vertically confined by the n-type cladding layer 12 and the p-type cladding layer 14 in the direction perpendicular to the active layer 13. Since the current block layer 15A has a lower refractive index than that of the cladding layers 12 and 14, the light is horizontally confined in the direction parallel to the active layer 13. Since the current block layer 15A is transparent to laser oscillation light, there is no light absorption, whereby a low loss waveguide can be implemented. Moreover, light distribution propagating through the waveguide can exude largely into the current block layer 15A. An effective refractive index difference ($\Delta n$) on the order of $10^{-3}$ suitable for high power operation can therefore be obtained easily. Moreover, the value of the effective refractive index difference can be precisely controlled on the order of $10^{-3}$ by the value dp described above. A low operating current, high power semiconductor laser can thus be obtained while precisely controlling light distribution.

In the infrared laser portion 2, on the other hand, a buffer layer 21, an n-type cladding layer 22, a quantum well active layer 23, a p-type cladding layer 24, a protective layer 25, and a p-type contact layer 26 are sequentially formed by epitaxial growth. The buffer layer 21 is made of n-type GaAs and has a thickness of 500 nm. The n-type cladding layer 22 is made of n-type AlGaInP and has a thickness of 2 μm. The quantum well active layer 23 is formed by a first guide layer 23g1 made of AlGaAs (aluminum gallium arsenide), well layers 23w1 through 23w3 made of GaAs and barrier layers 23b1, 23b2 made of AlGaAs, and a second guide layer 23g2 made of AlGaAs. The p-type cladding layer 24 is made of p-type AlGaInP. The protective layer 25 is made of p-type GaInP and has a thickness of 50 nm. The p-type contact layer 26 is made of p-type GaAs and has a thickness of 400 nm.

In the p-type cladding layer 24, a second ridge stripe portion (second ridge portion) is formed in parallel with the isolation groove 3. The distance between the top surface of the second ridge portion and the quantum well active layer (active layer) 23 is 1.4 μm and the distance (=dp) between the lower end of the second ridge portion and the active layer 23 is 0.24 μm A current block layer 15A is formed on both side surfaces and both sides of the second ridge portion in the p-type cladding layer 24. A strain relaxing layer 15B is formed only in a region opposite to the isolation groove 3 on the current block layer 15A. The current block layer 15A is made of $SiN_x$ and has a thickness of 200 nm, and the strain relaxing layer 15B is made of $ZrO_2$ and has a thickness of 50 nm. In the infrared laser portion 1 of the first embodiment, the strain relaxing layer 15B is thus formed only on the outer side of the second ridge portion.

In this structure, a current injected from the p-type contact layer 26 is confined by the second ridge portion due to the current block layer 15A and is therefore injected intensively to the active layer 23 located under the second ridge portion. A population inversion state of carriers required for laser oscillation is thus implemented by an injection current as low as several tens of milliamperes. Light emitted by recombination of the carriers injected to the active layer 23 is vertically confined by the n-type cladding layer 22 and the p-type cladding layer 24 in the direction perpendicular to the active layer 23. Since the current block layer 15A has a lower refractive index than that of the cladding layers 22 and 24, the light is horizontally confined in the direction parallel to the active layer 23. Since the current block layer 15A is transparent to laser oscillation light, there is no light absorption, whereby a low loss waveguide can be implemented. Moreover, light distribution propagating through the waveguide can exude largely into the current block layer 15A. An effective refractive index difference ($\Delta n$) on the order of $10^{-3}$ suitable for high power operation can therefore be obtained easily as in the red laser portion 1. Moreover, the value of the effective refractive index difference can be precisely controlled on the order of $10^{-3}$ by the value dp described above. A low operating current, high power semiconductor laser can thus be obtained while precisely controlling light distribution. Note that the strain relaxing layer 15B hardly affects refractive index distribution.

Hereinafter, respective thermal expansion coefficients of the p-type cladding layer 14 in the red laser portion 1, the p-type cladding layer 24 in the infrared laser portion 2, and the current block layer 15A and the strain relaxing layer 15b which are common to the two laser portions 1, 2 will be considered.

The p-type cladding layers 14, 24 made of p-type AlGaInP have a thermal expansion coefficient of 4.7 to 6.0, the current block layer 15A made of $SiN_x$ has a thermal expansion coefficient of 2.8 to 3.2, and the strain relaxing layer 15B made of $ZrO_2$ has a thermal expansion coefficient of 8.0 to 11.5. Provided that the respective thermal expansion coefficients of the p-type cladding layers 14, 24, the current block layer 15A, and the strain relaxing layer 15B are denoted by Tc, Tb, and Ts, respectively, it can be seen that the thermal expansion coefficients satisfy the relation of Tb<Tc<Ts.

It is herein assumed that the p-type contact layers 17, 26 in the semiconductor laser device of the first embodiment are mounted in a state called "p-side down" on a submount functioning as a heat sink having a relatively high thermal conductivity such as aluminum nitride (AlN) or silicon carbide (SiC). In the case where the strain relaxing layer 15B of $ZrO_2$ is formed on the whole surface of the current block layer 15A of $SiN_x$, the semiconductor laser device is curved with respect to the submount due to the difference in thermal expansion coefficient between the submount and the substrate 10 of n-type GaAs. More specifically, the mounted surface of the semiconductor laser device is convexly curved with respect to the submount.

The isolation groove 3 for electrically isolating the red laser portion 1 and the infrared laser portion 2 is formed on the center line in the width direction of the chip. At the respective light emitting points of the red laser portion 1 and the infrared laser portion 2, a large stress is applied to the outside of the first ridge portion in the red laser portion 1 that is provided away from the center line of the isolation groove 3 toward one side (the right side in the figure). Similarly, a large stress is applied to the outside of the second ridge portion in the infrared laser portion 2 that is provided away from the center line of the chip toward the other side (the left side in the figure). In the first embodiment, the respective light emitting points of the red laser portion 1 and the infrared laser portion 2 are left-right asymmetric with respect to the center line of the chip (isolation groove 3). An applied stress therefore varies depending on the ridge portion. Accordingly, a stress that is applied to the respective ridge portions in the respective light emitting points of the red laser portion 1 and the infrared laser portion 2 becomes left-right asymmetric.

As described above, stress asymmetry causes a shearing stress in semiconductor crystal of the laser device including the red laser portion 1 and the infrared laser portion 2, whereby a refractive index in the crystal changes into a birefringence. This causes rotation of a polarization plane of light traveling in a longitudinal direction of a cavity, degrading a polarization property. Moreover, since generation of crystal defects in the active layer cannot be prevented due to the stress in the crystal, it is difficult to simultaneously obtain both reliability and polarization property of the red laser portion 1 and the infrared laser portion 2. As a result, the yield of the laser device is degraded.

In the first embodiment, however, the strain relaxing layer 15B of $ZrO_2$ having a large thermal expansion coefficient is provided only on the outer sides of the respective ridge portions which are subjected to a relatively large stress in the red laser portion 1 and the infrared laser portion 2. This structure improves the left-right asymmetry of the stress that is applied to the respective ridge portions in the red laser portion 1 and the infrared laser portion 2. In other words, generation of crystal defects due to the strain applied locally to the respective ridge portions can be suppressed, and both the reliability and polarization property can be obtained in the red laser portion 1 and the infrared laser portion 2.

The following test was carried out in order to clarify the effect of forming the strain relaxing layer 15B having a different thermal expansion coefficient from that of the current block layer 15A only on the outer sides of the ridge portions which are subjected to a large stress on the current block layer 15A: conventional laser devices and laser devices of the present invention were fabricated and each laser device was mounted p-side down on a submount made of AlN (aluminum nitride), SiN (silicon nitride), or the like. In the conventional laser devices, the strain relaxing layer 15B of 50 nm thickness was formed on the whole surface of the current block layer 15A of 200 nm thickness. In the laser device of the present invention, the strain relaxing layer 15B of 50 nm thickness was formed only on the outer sides of the respective ridge portions which are subjected to a large stress on the current block layer 15A of 200 nm thickness in the red laser portion 1 and the infrared laser portion 2. A current was applied to the laser devices of each lot, and the laser devices exhibiting a small increase in operating current was considered to be acceptable. The aging test was performed at an operating temperature of 80° C., and an optical output of 100 mW (milliwatts).

Figure 2:
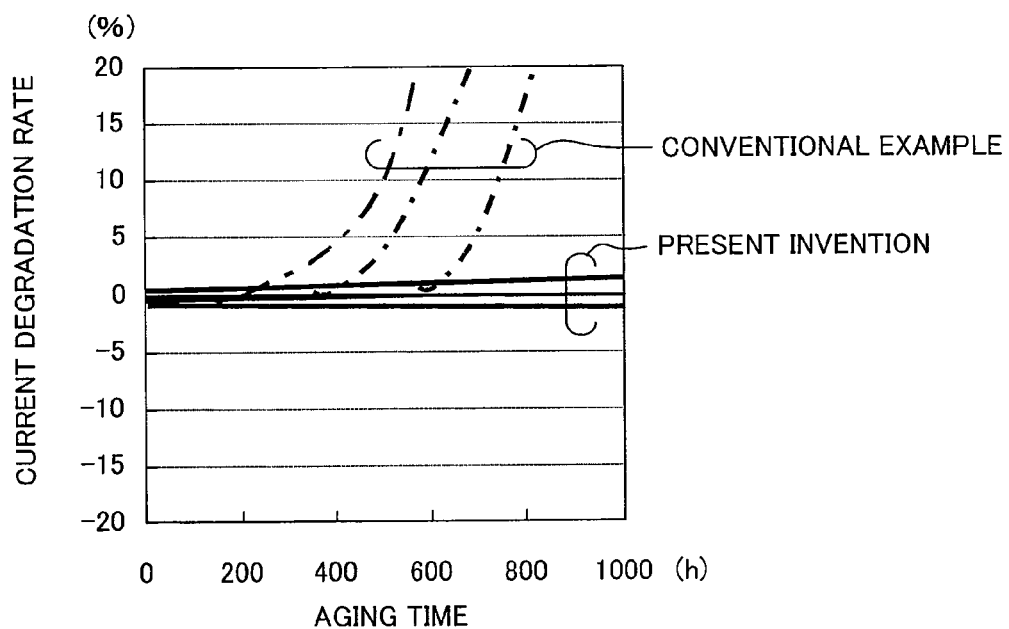
FIG. 2 is a graph showing a relation between the aging time and the current degradation rate in an aging test of the semiconductor laser device of the first embodiment of the present invention in comparison with a conventional example.

FIG. 2 shows a current degradation rate in the aging test. It can be seen from FIG. 2 that, regarding the conventional laser devices, an operating current value increased within several hundreds of hours in some laser devices and the rate of acceptable laser devices was about 70%. Regarding the laser devices of the present invention in which the strain relaxing layer 15B is formed only on the outer side of each ridge portion which is subjected to a large stress on the current block layer 15A, on the other hand, an operating current value did not increase for at least several thousands of hours and the ratio of acceptable laser devices was 100%.

This result was obtained for the following reason: since the strain relaxing layer 15B made of $ZrO_2$ having a large thermal expansion coefficient is formed only on the outer side of each ridge portion which is subjected to a large stress, strains cancel each other in the semiconductor material of each ridge portion and the stress in the crystal is reduced. This improves the left-right asymmetry of the stress that is applied to the ridge portions respectively having the light emitting points of the red laser portion 1 and the infrared laser portion 2 provided left-right asymmetrically with respect to the center of the chip. As a result, generation of crystal defects was suppressed, whereby the above result was obtained for the laser devices of the present invention.

In order to examine the effect of the present invention regarding the polarization property, the polarization ratio and the polarization angle were evaluated for the conventional laser devices and the laser devices of the present invention. For this evaluation, the conventional laser devices and the laser devices of the present invention were fabricated with six combinations of the rate of the position from the center line of the chip width to each light emitting point in the range of 9% to 35%.

Figure 3A:
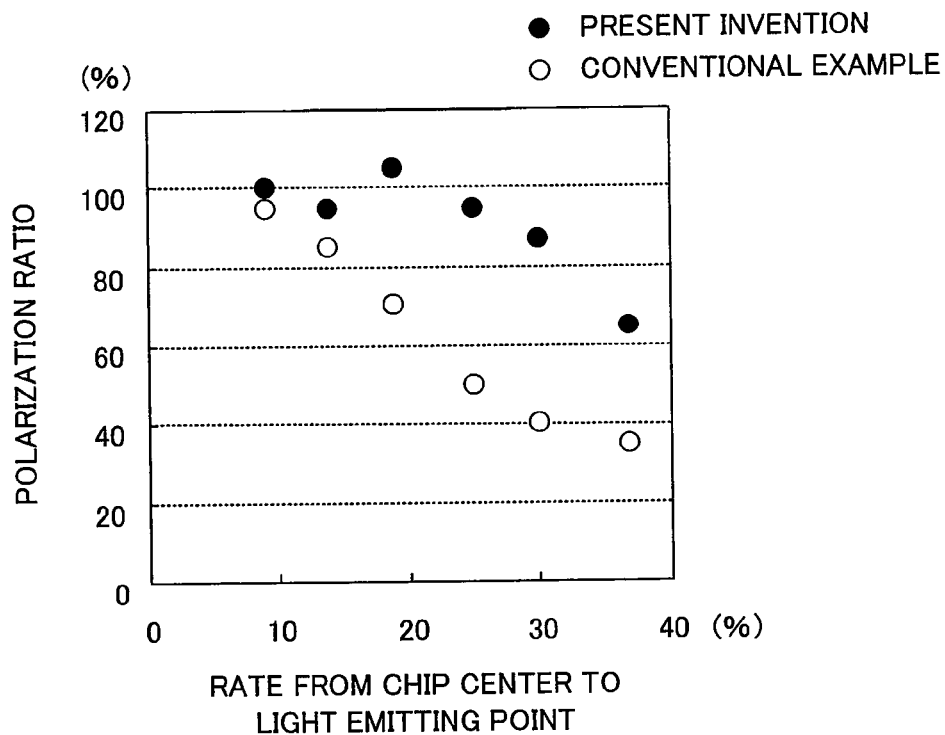
FIG. 3A is a graph showing a relation between the position of a light emitting point on a chip and the polarization ratio in the semiconductor laser device of the first embodiment of the present invention in comparison with a conventional example.
Figure 3B:
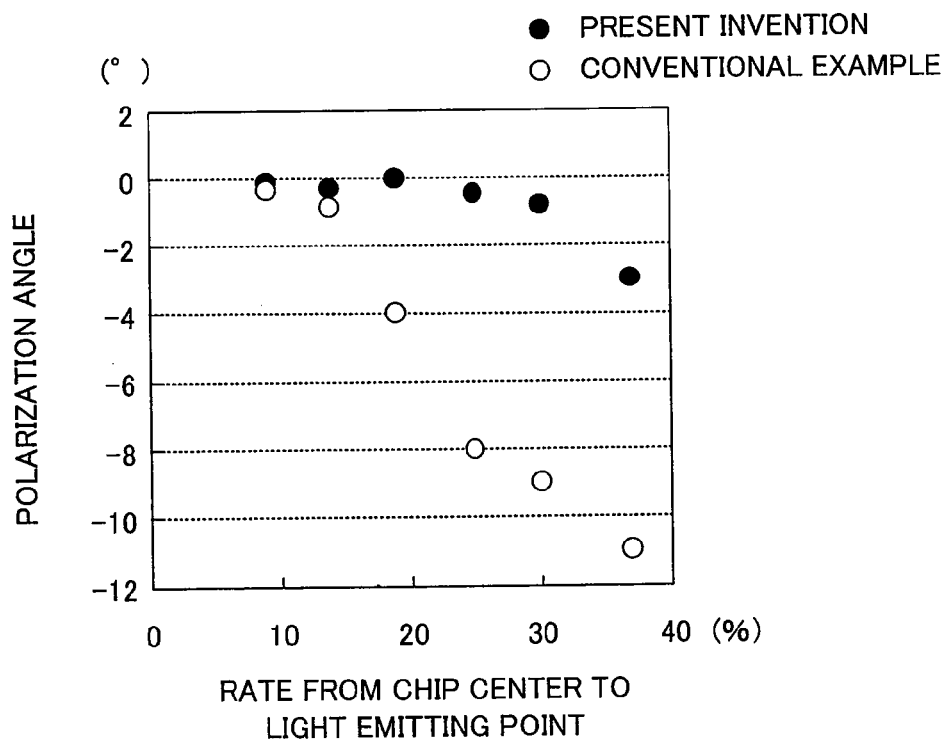
FIG. 3B is a graph showing a relation between the position of a light emitting point on a chip and the polarization angle in the semiconductor laser device of the first embodiment of the present invention in comparison with a conventional example.

FIG. 3A shows a polarization ratio of each laser device, and FIG. 3B shows a polarization angle of each laser device. It can be seen from FIGS. 3A and 3B that, in the conventional laser devices, the polarization property degrades rapidly with increase in the rate of the position from the center line of the chip width to each light emitting point. The rate of the position from the center line of the chip width to each light emitting point therefore needs to be at most 15% or less. In the laser devices of the present invention in which the strain relaxing layer 15B is provided only on the outer side of each ridge portion which is subjected to a large stress on the current block layer 15A, on the other hand, the polarization property is excellent and does not change even when the ratio of the position from the center line of the chip width to each light emitting point is 20% or less. Moreover, when the rate of the position from the center line of the chip width to each light emitting point is 30% or less, the polarization property is improved over the conventional structure in which the strain relaxing layer 15B is provided on the whole surface of the current block layer 15A.

Conventionally, one of the light emitting points of the red laser portion 1 and the infrared laser portion 2 is arranged at a position of 15% or less from the center line of the chip width according to application, even though this sacrifices the polarization property of the other light emitting point. This is because otherwise a stress is left-right asymmetrically applied to the ridge portions. In the first embodiment, the strain relaxing layer 15B made of $ZrO_2$ having a large thermal expansion coefficient is formed only in a portion that is subjected to a large stress. Strains therefore cancel each other in the semiconductor material of each ridge portion and the stress in the crystal is reduced. This improves the left-right asymmetry of the stress that is applied to the respective ridge portions in the red laser portion 1 and the infrared laser portion 2 which are positioned left-right asymmetrically with respect to the center line of the chip. As a result, the polarization property of each laser portion 1, 2 can be improved, and the polarization ratio and the polarization angle do not change even when the rate of the position from the center line of the chip width to each light emitting point is within 20%. Moreover, the polarization ratio can be improved over the conventional structure when the rate of the position from the center line of the chip width to each light emitting point is within 30%.

In order to clarify the effect of forming the strain relaxing layer 15B having a different thermal expansion coefficient from that of the current block layer 15A only on the outer sides of the ridge portions which are subjected to a large stress on the current block layer 15A, the inventors of the present application examined respective appropriate thickness ranges of the current block layer 15A and the strain relaxing layer 15B. The inventors of the present application then found that the appropriate thickness ranges were as $100\ nm \leq d1 \leq 450\ nm$ and $10\ nm \leq d2 \leq 300\ nm$ when d1 is the thickness of the current block layer 15A and d2 is the thickness of the strain relaxing layer 15B.

Figure 4:
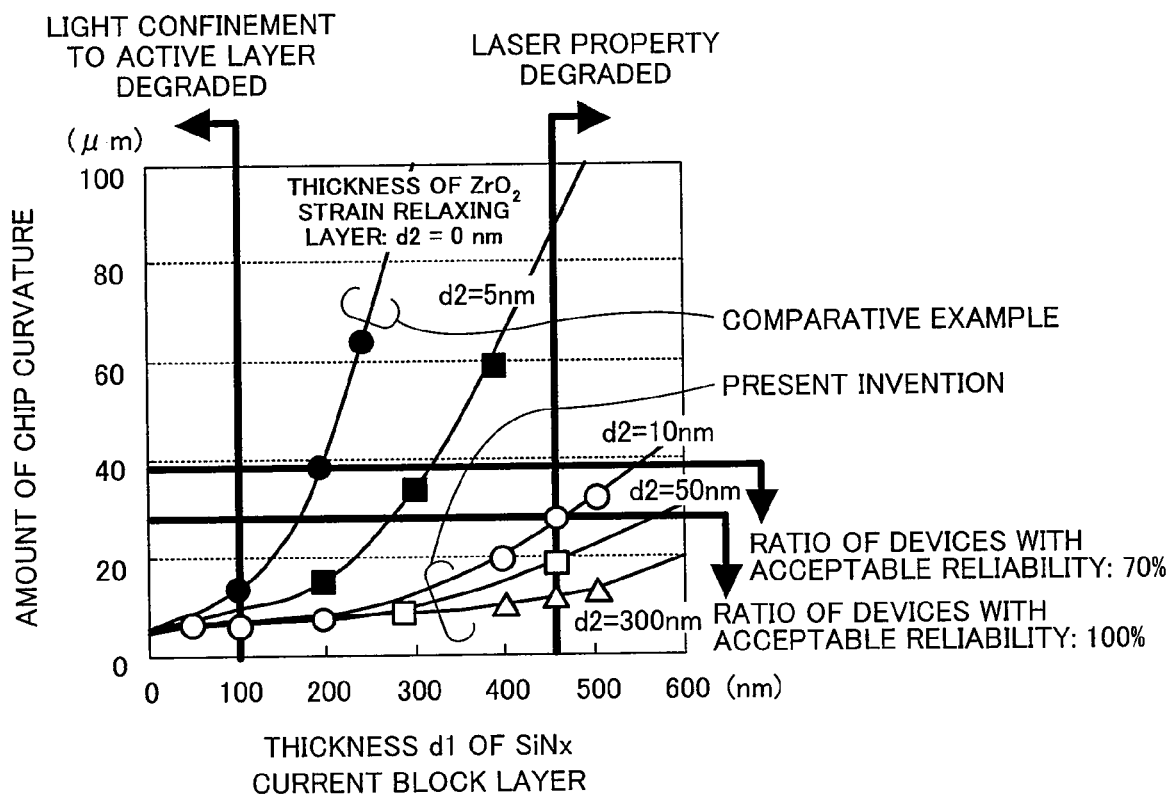
FIG. 4 is a graph showing a relation between the thickness of a current block layer and the amount of curvature and reliability in the semiconductor laser device of the first embodiment of the present invention.

FIG. 4 shows a relation between the amount of chip curvature and the reliability evaluation result for laser devices fabricated with various thicknesses of the current block layer 15A and various thickness of the strain relaxing layer 15B. The reliability of the laser devices was evaluated at an operating temperature of 80° C. and an optical output of 100 mW. Note that laser devices having no strain relaxing layer 15B on the current block layer 15A were also fabricated as a comparative example. Each semiconductor laser device was mounted p-side sown on a submount such as AlN.

As shown in FIG. 4, in the case where no strain relaxing layer 15B is provided and there is only the current block layer 15A (a comparative example [d2=0 nm] in the figure), the amount of chip curvature increases with increase in the thickness of the current block layer 15A. As a result, strains to the active layer 13, 23 are accumulated and crystal defects are generated. It can be therefore seen that the range in which both the light confinement effect in the active layers 13, 23 and the laser property and reliability can be obtained is very narrow.

In the case where the thickness d2 of the strain relaxing layer 15B is $10\ nm \leq d2 \leq 300\ nm$ and the thickness d1 of the current block layer 15A is $100\ nm \leq d1 \leq 450\ nm$, on the other hand, it can be seen that the amount of chip curvature is reduced and the reliability is improved significantly. Note that, in FIG. 4, the current block layer 15A is made of silicon nitride ($SiN_x$), and the strain relaxing layer 15B is made of zirconium oxide ($ZrO_2$). However, the present invention is not limited to this combination. It was confirmed that the same effects can be obtained for, for example, the following combinations as long as the above-described relation of Tb<Tc<Ts is satisfied: the current block layer 15A is made of silicon oxide ($SiO_2$) and the strain relaxing layer 15B is made of zirconium nitride (ZrN); the current block layer 15A is made of silicon nitride ($SiN_x$) and the strain relaxing layer 15B is made of aluminum oxide ($Al_2O_3$); and the current block layer 15A is made of amorphous silicon hydride (α-Si) and the strain relaxing layer 15B is made of aluminum oxide ($Al_2O_3$). The thermal expansion coefficient of each material is shown in Table 1 for reference.

TABLE 1

| Material | Thermal expansion coefficient ($\times 10^{-6}$/K) |
|---|---|
| GaAs | 5.7 |
| GaN | 5.6 |
| AlGaInP | 4.7-6.0 |
| $SiN_x$ | 2.8-3.2 |
| $ZrO_2$ | 8.0-11.5 |
| $Al_2O_3$ | 5.8-8.0 |
| $SiO_2$ | 0.6-0.9 |
| α-Si | ≦0.6 |

As has been described above, in the semiconductor laser device of the present invention, the isolation grove 3 for electrically isolating the red laser portion 1 and the infrared laser portion 2 from each other is provided along the center line of the chip width, and the strain relaxing layer having a different thermal expansion coefficient from that of the current block layer 15A is provided only on the outer sides of the respective ridge portions of the red laser portion 1 and the infrared laser portion 2 which are subjected to a large stress. With this structure, strains cancel each other in the semiconductor material of each ridge portion and the stress in the crystal is reduced. This improves the left-right asymmetry of the stress that is applied to the respective ridge portions of the red laser portion 1 and the infrared laser portion 2 provided left-right asymmetrically with respect to the center line of the chip. As a result, generation of crystal defects in the active layers 13, 23 of the red laser portion 1 and the infrared laser portion 2 are suppressed, whereby reduction in reliability can be prevented as well as improvement in polarization property can be achieved.

Hereinafter, a manufacturing method of a two-wavelength semiconductor laser device structured as described above will now be described with reference to the figures.

FIGS. 5A through 5C, FIGS. 6A through 6C, and FIGS. 7A and 7B show cross-sectional structures sequentially illustrating the steps of the manufacturing method of a semiconductor laser device according to the first embodiment of the present invention.

Figure 5A:
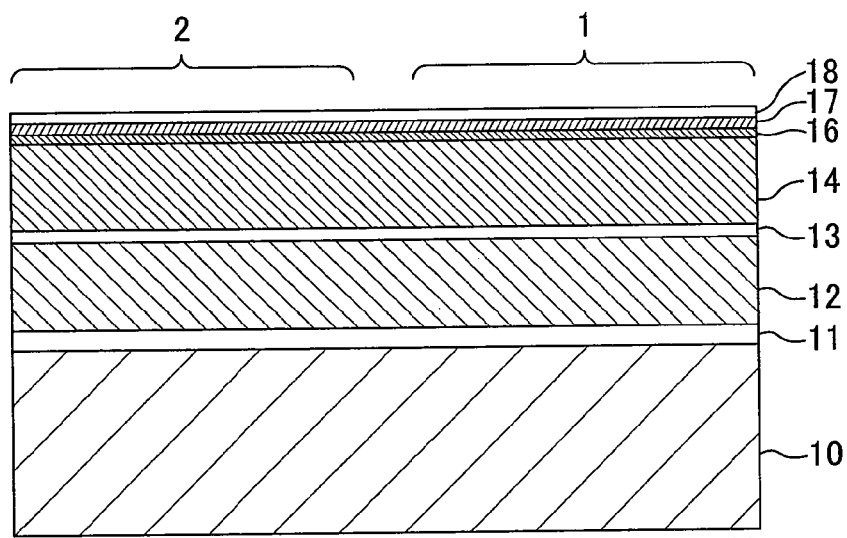
FIGS. 5A, 5B, and 5C are cross-sectional views sequentially showing the steps of a manufacturing method of the semiconductor laser device according to the first embodiment of the present invention.

First, as shown in FIG. 5A, a buffer layer 11, an n-type cladding layer 12, a strained quantum well active layer 13, a p-type cladding layer 14, a protective layer 16, a p-type contact layer 17, and a boundary layer 18 are sequentially formed on a main surface of an n-type GaAs substrate 10 by, for example, a metal organic chemical vapor deposition (MOCVD) method to form a first epitaxial layer. More specifically, the buffer layer 11 is made of n-type GaAs and has a thickness of 500 nm. The n-type cladding layer 12 is made of n-type AlGaInP and has a thickness of 2 μm. The strained quantum well active layer 13 is formed by a first guide layer 13g1 made of AlGaInP, well layers 13w1 through 13w3 made of GaInP and barrier layers 13b1, 13b2 made of AlGaInP, and a second guide layer 13g2 made of AlGaInP. The p-type cladding layer 14 is made of p-type AlGaInP, and the protective layer 16 is made of p-type GaInP and has a thickness of 50 nm. The p-type contact layer 17 is made of p-type GaAs and has a thickness of 400 nm. The boundary layer 18 is made of p-type GaInP and has a thickness of 5 nm.

In the first embodiment, a strained quantum well structure is used for the active layer 13. However, a non-strained quantum well structure or bulk may alternatively be used for the active layer 13. The conductivity type of the active layer 13 is not specifically limited and may be either p-type or n-type. The active layer 13 may alternatively be of an undoped type.

Figure 5B:
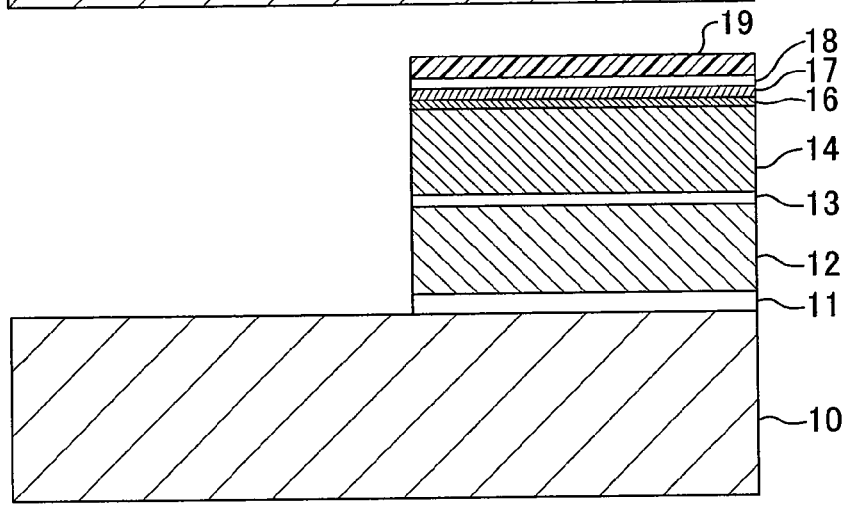

Next, as shown in FIG. 5B, the substrate 10 having the first epitaxial layer formed thereon is removed from a MOCVD reactor. A first resist pattern 19 is then formed by a lithography method so as to cover the red laser portion 1. By using the first resist pattern 19 as a mask, the first epitaxial layer is removed by wet etching so that the first epitaxial layer is left only in the red laser portion 1. An etchant containing sulfuric acid ($H_2SO_4$) or hydrochloric acid (HCl) as a main component is used in the wet etching.

Figure 5C:
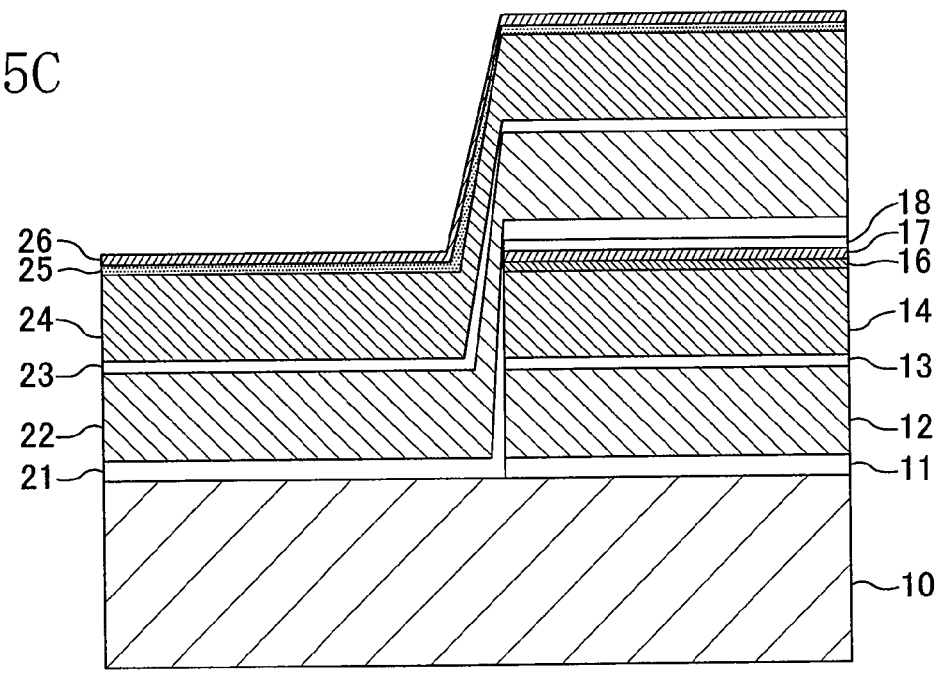

As shown in FIG. 5C, after the first resist pattern 19 is removed, a buffer layer 21, an n-type cladding layer 22, a quantum well active layer 23, a p-type cladding layer 24, a protective layer 25, and a p-type contact layer 26 are sequentially formed on the whole surface of the substrate 10 by a MOCVD method to form a second epitaxial layer. The buffer layer 21 is made of n-type GaAs and has a thickness of 500 nm. The n-type cladding layer 22 is made of n-type AlGaInP and has a thickness of 2 μm. The quantum well active layer 23 is formed by a first guide layer 23g1 made of AlGaAs, well layers 23w1 through 23w3 made of GaAs and barrier layers 23b1, 23b2 made of AlGaAs, and a second guide layer 23g2 made of AlGaAs. The p-type cladding layer 24 is made of p-type AlGaInP. The protective layer 25 is made of p-type GaInP and has a thickness of 50 nm. The p-type contact layer 26 is made of p-type GaAs and has a thickness of 400 nm.

Figure 6A:
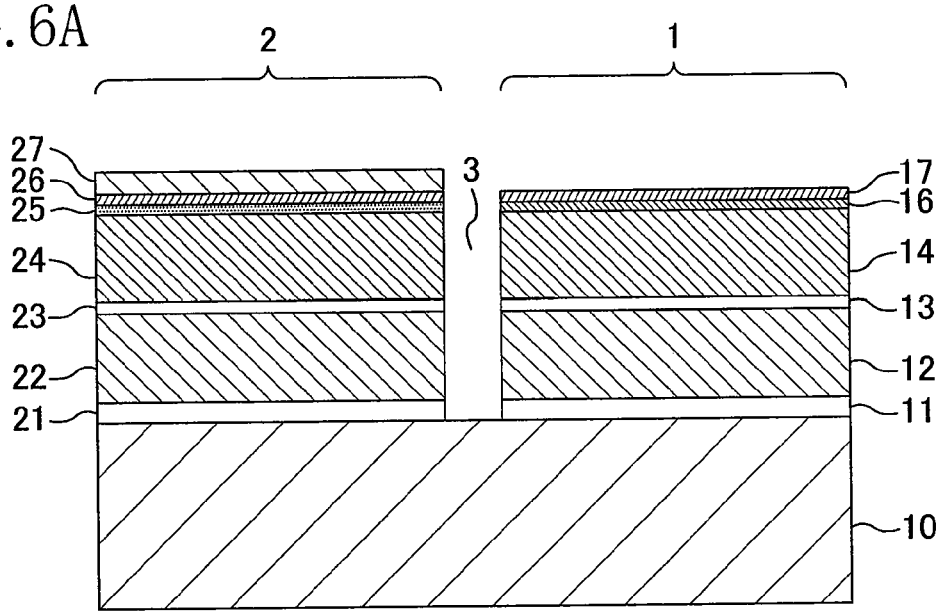
FIGS. 6A, 6B, and 6C are cross-sectional views sequentially showing the steps of the manufacturing method of the semiconductor laser device according to the first embodiment of the present invention.

As shown in FIG. 6A, the substrate 10 having the first and second epitaxial layers formed thereon is then removed from the MOCVD reactor. Thereafter, a second resist pattern 27 is formed by a lithography method so as to cover the infrared laser portion 2. By using the second resist pattern 27 as a mask, the second epitaxial layer is removed by wet etching so that the second epitaxial layer is left only in the infrared laser portion 2. An etchant containing $H_2SO_4$ or HCl as a main component is used in the wet etching.

Figure 6B:
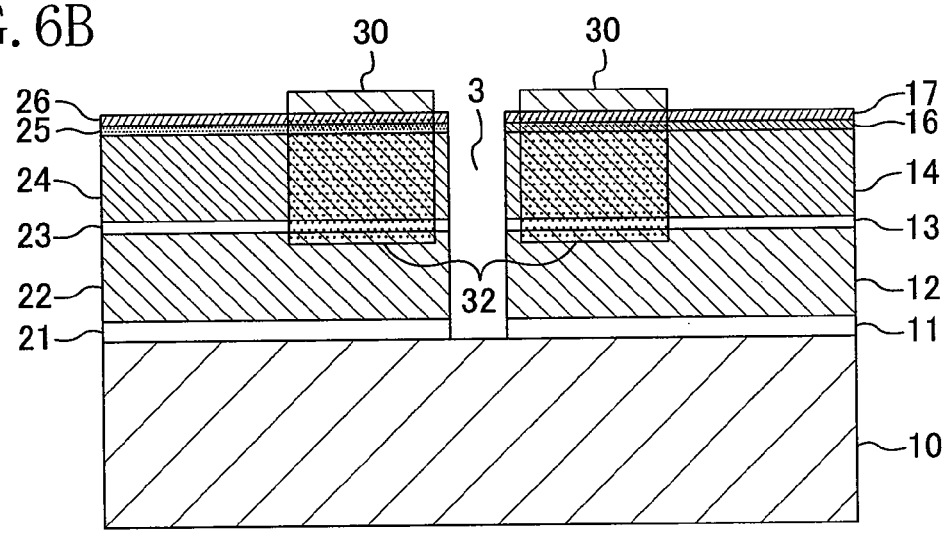

Next, as shown in FIG. 6B, after the second resist pattern 27 is removed, a diffusion source 30 and a cap film (not shown) are deposited on the p-type contact layers 17, 26 by an atmospheric pressure thermal CVD (chemical vapor deposition) method at 370° C. The diffusion source 30 is made of zinc oxide (ZnO) and has a thickness of 50 nm, and the cap film is made of silicon nitride ($SiN_x$) and has a thickness of 100 nm. The diffusion source 30 and the cap layer thus deposited are then patterned by a lithography method and a dry etching method so as to have a predetermined window length. The diffusion source 30 is then annealed to selectively diffuse Zn (zinc) into regions that will serve as both end faces of a cavity in the active layers 13, 23. A Zn diffused region 32 disordering the regions of both end faces of the cavity is thus formed in each active layer 13, 23, whereby a window region is formed in each active layer 13, 23.

Figure 6C:
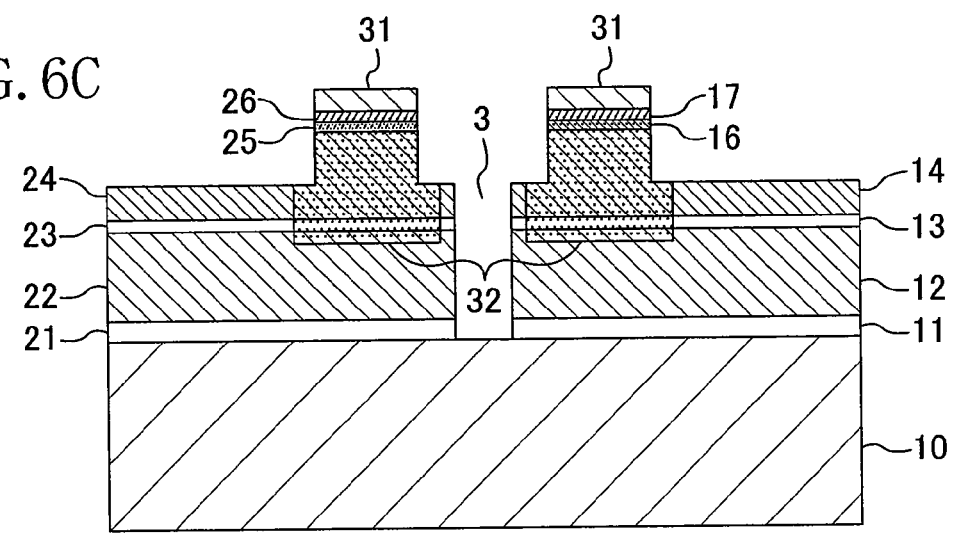

As shown in FIG. 6C, a mask film 31 made of silicon oxide and having a thickness of 0.3 μm is deposited over the protective layers 16, 25 by an atmospheric pressure thermal CVD method at 370° C. The mask film 31 is then patterned into a ridge stripe shape by a lithography method and a dry etching method. The p-type contact layers 17, 26, the protective layers 16, 25, and the p-type cladding layers 14, 24 are then sequentially etched by using the ridge-stripe shaped mask film 31 as a mask. A mesa-shaped ridge portion is thus formed in each of the red laser portion 1 and the infrared laser portion 2 in the hetero structure substrate having two epitaxial layers. Note that the order of performing the steps of FIGS. 6B and 6C is not specifically limited. Although the width of each ridge portion is herein set to about 3 μm, the width of each ridge portion may be any value of 5 μm or less.

Figure 7A:
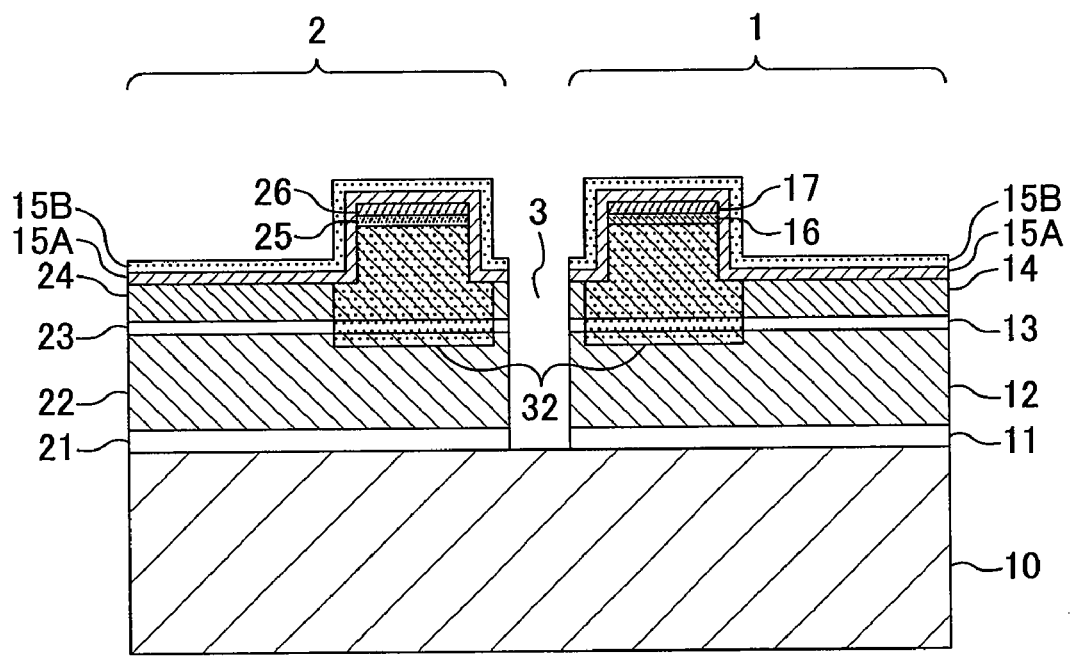
FIGS. 7A and 7B are cross-sectional views showing the steps of the manufacturing method of the semiconductor laser device according to the first embodiment of the present invention.

As shown in FIG. 7A, after the mesa-shaped ridge portions are formed, the mask film 31 is removed by an etchant containing hydrofluoric acid (HF) as a main component. A current block layer 15A and a strain relaxing layer 15B are then sequentially deposited on the whole surface of the p-type cladding layers 14, 24 including each ridge portion by, for example, a CVD method or a sputtering method. The current block layer 15A is made of $SiN_x$ and has a thickness of 200 nm, and the strain relaxing layer 15B is made of $ZrO_2$ and has a thickness of 50 nm.

Figure 7B:
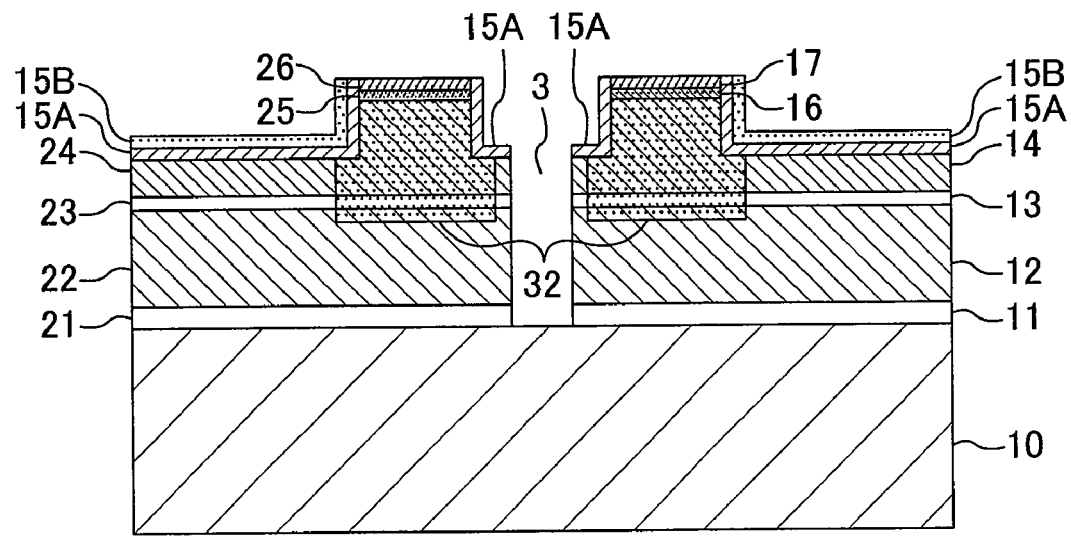

Next, as shown in FIG. 7B, a third resist pattern (not shown) is formed on the strain relaxing layer 15B by a lithography method so as to expose the top surface of each ridge portion and the respective inner sides of the ridge portions. By using the third resist pattern as a mask, the strain relaxing layer 15B is wet-etched by an etchant containing HF as a main component, whereby the p-type contacts 17, 26 are exposed from the top surface of the ridge portions and the current block layer 15 is exposed from the inner sides of the ridge portions.

The manufacturing method of the semiconductor laser device according to the first embodiment is thus characterized in that the strain relaxing layer 15B is provided in a region that is subjected to a large stress on the outside of each ridge portion. The manufacturing method of the semiconductor laser device according to the first embodiment has two effects, that is, suppression of a stress in the laser device itself and suppression of a stress that is applied when the laser device is mounted. In other words, a stress that is applied to the ridge portions respectively having a first light emitting point and a second light emitting point can be reduced, and the left-right asymmetry of the stress can be suppressed. As a result, generation of crystal defects due to the strain applied locally to each ridge portion is suppressed, whereby both reliability and polarization property can be obtained in the red laser portion 1 having the first light emitting point and the infrared laser portion 2 having the second light emitting point.

Note that, in the step of FIG. 6B, the window region 32 is formed in the red laser portion 1 and the infrared laser portion 2 by the same heat history (a single heat treatment step). This enables reduction in the number of steps, resulting in reduction in manufacturing cost.

Second Embodiment

Hereinafter, a second embodiment of the present invention will be described with reference to the drawings.

Figure 8:
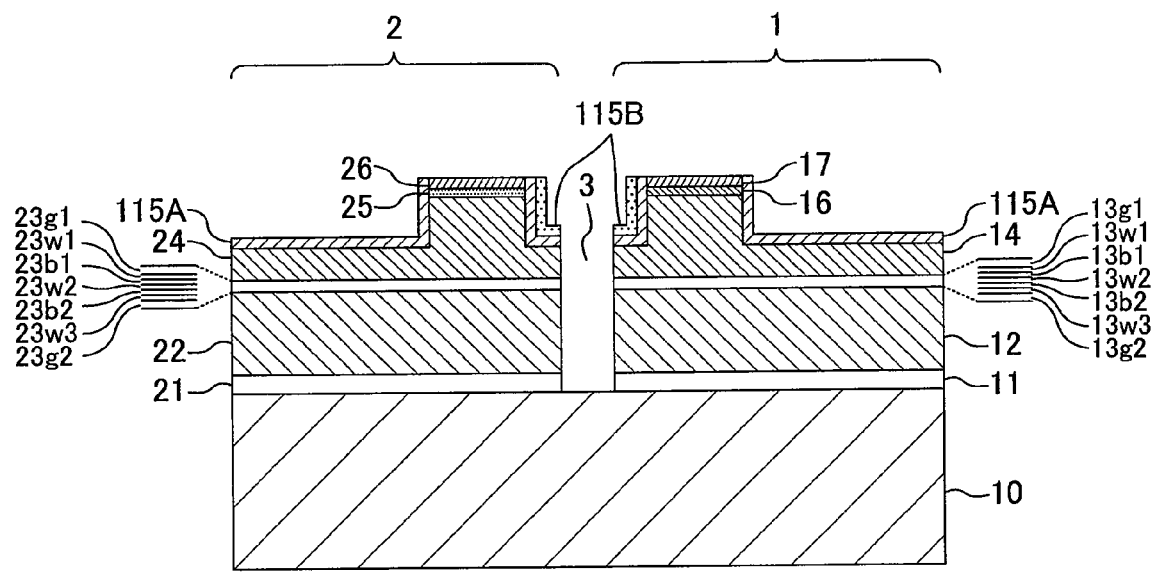
FIG. 8 is a cross-sectional view showing a semiconductor laser device according to a second embodiment of the present invention.

FIG. 8 shows a cross-sectional structure of a semiconductor laser device according to the second embodiment of the present invention. As shown in FIG. 8, a red laser portion 1 and an infrared laser portion 2 are electrically isolated from each other by an isolation groove 3 and are monolithically integrated on a main surface of a substrate 10. The substrate 10 is made of, for example, n-type GaAs. The center line of the isolation groove 3 herein matches the center line in a width direction (the left-right direction in FIG. 8) of a chip. In the second embodiment, the chip width is 250 μm, and both light emitting points in the red laser portion 1 and the infrared laser portion 2 have a displacement rate of 20% of the chip width from the center line in the width direction of the chip. Note that the above displacement rate is shown by way of example only, and the red laser portion 1 and the infrared laser portion 2 may have different displacement rates as in the first embodiment.

Each epitaxial layer made of a compound semiconductor in the red laser portion 1 and the infrared laser portion 2 is the same as that in the first embodiment. The epitaxial layers are therefore denoted by the same reference numerals and characters as those of the first embodiment and description thereof will be omitted.

In the second embodiment, a current block layer 115A is formed on the p-type cladding layers 14, 24 except the top surface of each ridge portion. A strain relaxing layer 115B is formed only in a region facing the isolation groove 3 on the current block layer 115A. For example, the current block layer 115A is made of zirconium oxide ($ZrO_2$) and has a thickness of 200 nm, and the strain relaxing layer 115B is made of silicon oxide ($SiO_2$) and has a thickness of 50 nm. In the red laser portion 1 and the infrared laser portion 2 of the second embodiment, the strain relaxing layer 115B is thus formed only on the inside region where the ridge portions face each other.

The p-type cladding layers 14, 24 made of p-type AlGaInP have a thermal expansion coefficient of 4.7 to 6.0, the current block layer 115A made of $ZrO_2$ has a thermal expansion coefficient of 8.0 to 11.5, and the strain relaxing layer 115B made of $SiO_2$ has a thermal expansion coefficient of 0.6 to 0.9. Provided that the respective thermal expansion coefficients of the p-type cladding layers 14, 24, the current block layer 115A, and the strain relaxing layer 115B are denoted by Tc, Tb, and Ts, respectively, it can be seen that the thermal expansion coefficients satisfy the relation of $Ts<Tc<Tb$.

It is herein assumed that the strain relaxing layer 115B having a small thermal expansion coefficient is formed on the whole surface of the current block layer 115A having a large thermal expansion coefficient and such a semiconductor laser device is mounted p-side down on a submount functioning as a heat sink having a higher thermal conductivity than GaAs, such as copper (Cu). In this case, the semiconductor laser device is concavely curved with respect to the mounting surface of the submount due to the difference in thermal expansion coefficient between the submount and the substrate 10.

A large stress is therefore applied to the outside of the first ridge portion in the red laser portion 1 that is provided away from the center line of the chip toward one side (the right side in the figure). Similarly, a large stress is applied to the outside of the second ridge portion in the infrared laser portion 2 that is provided away from the center line of the chip toward the other side (the left side in the figure). Accordingly, a stress that is applied to the respective ridge portions in the red laser portion 1 and the infrared laser portion 2 becomes left-right asymmetric.

As described above, this left-right asymmetry of the stress causes a shearing stress in semiconductor crystal of the laser device, whereby a refractive index in the crystal changes into a birefringence. This causes rotation of a polarization plane of light traveling in a longitudinal direction of a cavity, degrading the polarization ratio. It is therefore difficult to simultaneously obtain the polarization property in both the red laser portion 1 and the infrared laser portion 2.

In the second embodiment, however, the strain relaxing layer 115B having a small thermal expansion coefficient is provided only on the inner sides of the ridge portions in the red laser portion 1 and the infrared laser portion 2. Strains therefore cancel each other in the semiconductor material of each ridge portion. This improves the left-right asymmetry of the stress that is applied to the ridge portions in the red laser portion 1 and the infrared laser portion 2 provided left-right symmetrically with respect to the center line of the chip. As a result, the polarization property of each laser portion 1, 2 can be improved.

As has been described above, the isolation groove 3 for electrically isolating the red laser portion 1 and the infrared laser portion 2 from each other is provided on the center line in the width direction of the chip, and the strain relaxing layer 115B having a smaller thermal expansion coefficient than that of the current block layer 115A is formed on the current block layer 115A on the inner sides of the ridge portions in the red laser portion 1 and the infrared laser portion 2. With this structure, strains therefore cancel each other in the semiconductor material of each ridge portion. This improves the left-right asymmetry of the stress that is applied to the ridge portions in the red laser portion 1 and the infrared laser portion 2 provided left-right symmetrically with respect to the center line of the chip. As a result, the polarization property in the red laser portion 1 and the infrared laser portion 2 can be improved.

Third Embodiment

Hereinafter, a third embodiment of the present invention will be described with reference to the drawings.

Figure 9:
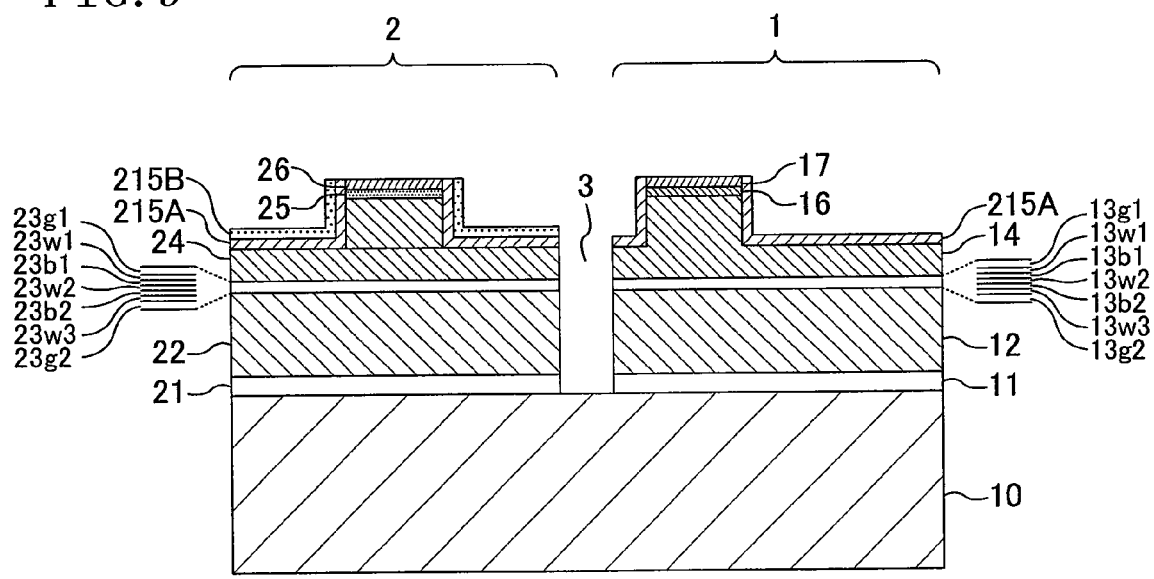
FIG. 9 is a cross-sectional view showing a semiconductor laser device according to a third embodiment of the present invention.

FIG. 9 shows a cross-sectional structure of a semiconductor laser device according to the third embodiment of the present invention. As shown in FIG. 9, a red laser portion 1 and an infrared laser portion 2 are electrically isolated from each other by an isolation groove 3 and are monolithically integrated on a main surface of a substrate 10. The substrate 10 is made of, for example, n-type GaAs. The center line of the isolation groove 3 herein matches the center line in a width direction (the left-right direction in FIG. 9) of a chip. In the third embodiment, the chip width is 250 μm, and a light emitting point in the red laser portion 1 has a displacement rate of 10% of the chip width from the center line in the width direction of the chip, and a light emitting point in the infrared laser portion 2 has a displacement rate of 30% of the chip width from the center line in the width direction of the chip.

Each epitaxial layer made of a compound semiconductor in the red laser portion 1 and the infrared laser portion 2 is the same as that in the first embodiment. The epitaxial layers are therefore denoted by the same reference numerals and characters as those of the first embodiment and description thereof will be omitted.

In the third embodiment, a current block layer 215A is formed on the p-type cladding layers 14, 24 except the top surface of each ridge portion. A strain relaxing layer 215B is formed only on the current block layer 215A in the infrared laser portion 2. For example, the current block layer 215A is made of silicon nitride ($SiN_x$) and has a thickness of 200 nm, and the strain relaxing layer 215B is made of zirconium oxide ($ZrO_2$) and has a thickness of 50 nm. In the third embodiment, the strain relaxing layer 215B is thus formed only on both sides of the second ridge portion in the infrared laser portion 2.

The p-type cladding layers 14, 24 made of p-type AlGaInP have a thermal expansion coefficient of 4.7 to 6.0, the current block layer 215A made of $SiN_x$ has a thermal expansion coefficient of 2.8 to 3.2, and the strain relaxing layer 215B made of $ZrO_2$ has a thermal expansion coefficient of 8.0 to 11.5. Provided that the respective thermal expansion coefficients of the p-type cladding layers 14, 24, the current block layer 215A, and the strain relaxing layer 215B are denoted by Tc, Tb, and Ts, respectively, it can be seen that the thermal expansion coefficients satisfy the relation of $Tb<Tc<Ts$.

It is herein assumed that the strain relaxing layer 215B having a large thermal expansion coefficient is formed on the whole surface of the current block layer 215A having a small thermal expansion coefficient in the red laser portion 1 and the infrared laser portion 2, and such a semiconductor laser device is mounted p-side down on a submount functioning as a heat sink having a high thermal conductivity such as aluminum nitride (AlN) and silicon carbide (SiC). In this case, the semiconductor laser device is convexly curved with respect to the mounting surface of the submount due to the difference in thermal expansion coefficient between the submount and the substrate 10.

A large stress is therefore applied to the outside of the first ridge portion in the red laser portion 1 that is provided away from the center line of the chip toward one side (the right side in the figure). Similarly, a large stress is applied to the outside of the second ridge portion in the infrared laser portion 2 that is provided away from the center line of the chip toward the other side (the left side in the figure). Accordingly, a stress that is applied to the respective ridge portions in the red laser portion 1 and the infrared laser portion 2 becomes left-right asymmetric.

As described above, this left-right asymmetry of the stress causes a shearing stress in semiconductor crystal of the laser device, whereby a refractive index in the crystal changes into a birefringence. This causes rotation of a polarization plane of light traveling in a longitudinal direction of a cavity, degrading the polarization ratio. It is therefore difficult to simultaneously obtain the polarization property in both the red laser portion 1 and the infrared laser portion 2.

In the third embodiment, however, the strain relaxing layer 215B having a large thermal expansion coefficient is provided only in the infrared laser portion 2 having a displacement rate as high as 30% of the chip width from the center line of the chip. Strains therefore cancel each other in the semiconductor material of the second ridge portion. This improves the left-right asymmetry of the stress that is applied to the ridge portions in the red laser portion 1 and the infrared laser portion 2 provided left-right asymmetrically with respect to the center line of the chip. Especially, degradation in polarization property can be prevented in the infrared laser portion 2 that is located far from the center line of the chip.

Note that, in the example shown in the third embodiment, the strain relaxing layer 215B made of $ZrO_2$ and having a uniform thickness of 50 nm is formed on both sides of the ridge portion in the infrared laser portion 2. However, a larger stress is applied to the outside (the opposite side to the isolation groove 3) of the second ridge portion in the infrared laser portion 2. It is therefore preferable to vary the thickness of the strain relaxing layer 215B between the inner side (the side facing the isolation groove 3) and outer side of the second ridge portion. For example, in the case where the thickness of the strain relaxing layer 215B is larger (for example, 60 nm) on the outer side of the second ridge portion than on the inner side thereof, the left-right asymmetry of the stress that is applied to the chip can further be improved. This structure therefore has an effect on improvement in polarization property.

As has been described above, the isolation groove 3 for electrically isolating the red laser portion 1 and the infrared laser portion 2 from each other is provided on the center line in the width direction of the chip, and the strain relaxing layer 215B having a larger thermal expansion coefficient than that of the current block layer 215A is provided only on both sides of the second ridge portion in the infrared laser portion 2 on the current block layer 215A. With this structure, strains therefore cancel each other in the semiconductor material of the second ridge portion. This improves the left-right asymmetry of the stress that is applied to the ridge portions in the red laser portion 1 and the infrared laser portion 2 provided left-right asymmetrically with respect to the center line of the chip. As a result, the polarization property in the red laser portion 1 and the infrared laser portion 2 can be improved.

Fourth Embodiment

Hereinafter, a fourth embodiment of the present invention will be described with reference to the drawings.

Figure 10:
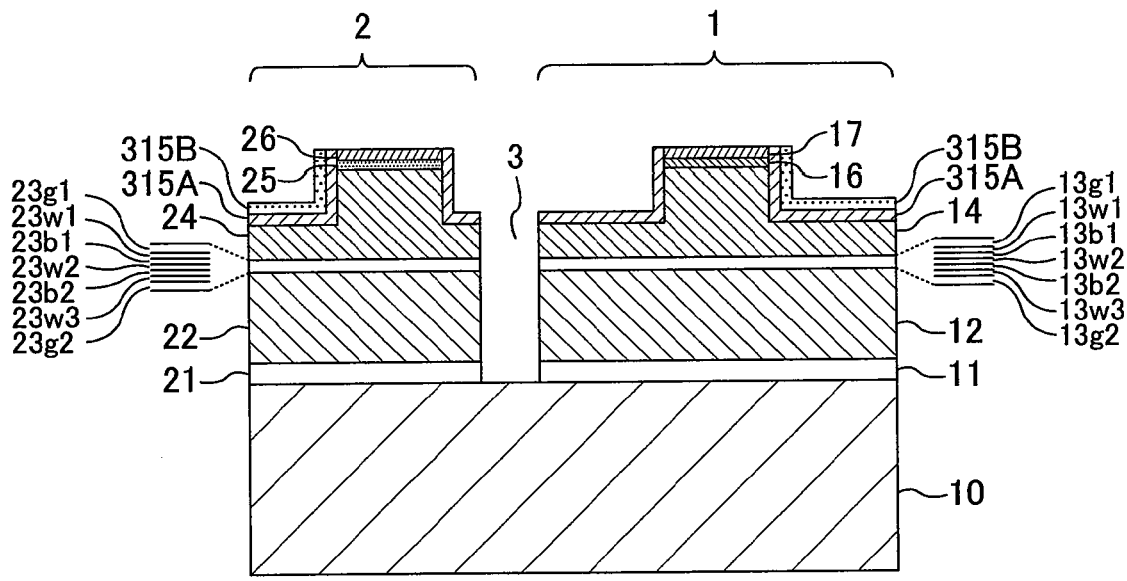
FIG. 10 is a cross-sectional view showing a semiconductor laser device according to a fourth embodiment of the present invention.

FIG. 10 shows a cross-sectional structure of a semiconductor laser device according to the fourth embodiment of the present invention. As shown in FIG. 10, a red laser portion 1 and an infrared laser portion 2 are electrically isolated from each other by an isolation groove 3 and are monolithically integrated on a main surface of a substrate 10. The substrate 10 is made of, for example, n-type GaAs. The center line of the isolation groove 3 is herein displaced by about 10% from the center line in a width direction (the left-right direction in FIG. 10) of a chip toward the infrared laser portion 2. In the fourth embodiment, the chip width is 250 μm, and both light emitting points in the red laser portion 1 and the infrared laser portion 2 have a displacement rate of 20% of the chip width from the center line in the width direction of the chip. Note that the above displacement rate is shown by way of example only, and the red laser portion 1 and the infrared laser portion 2 may have other displacement rates as in the first embodiment.

Each epitaxial layer made of a compound semiconductor in the red laser portion 1 and the infrared laser portion 2 is the same as that in the first embodiment. The epitaxial layers are therefore denoted by the same reference numerals and characters as those of the first embodiment and description thereof will be omitted.

In the fourth embodiment, a current block layer 315A is formed on the p-type cladding layers 14, 24 except the top surface of each ridge portion. A strain relaxing layer 315B is formed only in an outer region of the isolation groove 3 on the current block layer 315A. For example, the current block layer 315A is made of silicon nitride ($SiN_x$) and has a thickness of 200 nm, and the strain relaxing layer 315B is made of zirconium oxide ($ZrO_2$) and has a thickness of 50 nm. In the fourth embodiment, the strain relaxing layer 315B is thus formed only on the outer side of each ridge portion in the red laser portion 1 and the infrared laser portion 2.

The p-type cladding layers 14, 24 made of p-type AlGaInP have a thermal expansion coefficient of 4.7 to 6.0, the current block layer 315A made of $SiN_x$ has a thermal expansion coefficient of 2.8 to 3.2, and the strain relaxing layer 315B made of $ZrO_2$ has a thermal expansion coefficient of 8.0 to 11.5. Provided that the respective thermal expansion coefficients of the p-type cladding layers 14, 24, the current block layer 315A, and the strain relaxing layer 315B are denoted by Tc, Tb, and Ts, respectively, it can be seen that the thermal expansion coefficients satisfy the relation of Tb<Tc<Ts.

It is herein assumed that the strain relaxing layer 315B having a large thermal expansion coefficient is formed on the whole surface of the current block layer 315A having a small thermal expansion coefficient in the red laser portion 1 and the infrared laser portion 2, and such a semiconductor laser device is mounted p-side down on a submount functioning as a heat sink having a high thermal conductivity such as aluminum nitride (AlN) and silicon carbide (SiC). In this case, the semiconductor laser device is convexly curved with respect to the mounting surface of the submount due to the difference in thermal expansion coefficient between the submount and the substrate 10.

A large stress is therefore applied to the outside of the first ridge portion in the red laser portion 1 that is provided away from the center line of the chip toward one side (the right side in the figure). Similarly, a large stress is applied to the outside of the second ridge portion in the infrared laser portion 2 that is provided away from the center line of the chip toward the other side (the left side in the figure). Accordingly, a stress that is applied to the respective ridge portions in the red laser portion 1 and the infrared laser portion 2 becomes left-right asymmetric.

As described above, this left-right asymmetry of the stress causes a shearing stress in semiconductor crystal of the laser device, whereby a refractive index in the crystal changes into a birefringence. This causes rotation of a polarization plane of light traveling in a longitudinal direction of a cavity, degrading the polarization ratio. It is therefore difficult to simultaneously obtain the polarization property in both the red laser portion 1 and the infrared laser portion 2.

In the fourth embodiment, however, the strain relaxing layer 315B having a large thermal expansion coefficient is provided only on the outer side of each ridge portion in the red laser portion 1 and the infrared laser portion 2. Strains therefore cancel each other in the semiconductor material of each ridge portion. This improves the left-right asymmetry of the stress that is applied to the ridge portions in the red laser portion 1 and the infrared laser portion 2 provided left-right symmetrically from the center line of the chip. The polarization property of each laser portion 1, 2 can therefore be improved.

As has been described above, the isolation groove 3 for electrically isolating the red laser portion 1 and the infrared laser portion 2 from each other is provided asymmetrically with respect to the center line in the width direction of the chip, and the strain relaxing layer 315B having a larger thermal expansion coefficient than that of the current block layer 315A is provided on the outer side of each ridge portion in the red laser portion 1 and the infrared laser portion 2 on the current block layer 315A. With this structure, strains therefore cancel each other in the semiconductor material of each ridge portion. This improves the left-right asymmetry of the stress that is applied to the ridge portions in the red laser portion 1 and the infrared laser portion 2 provided left-right symmetrically from the center line of the chip. As a result, the polarization property in the red laser portion 1 and the infrared laser portion 2 can be improved.

Fifth Embodiment

Hereinafter, a fifth embodiment of the present invention will be described with reference to the drawings.

Figure 11:
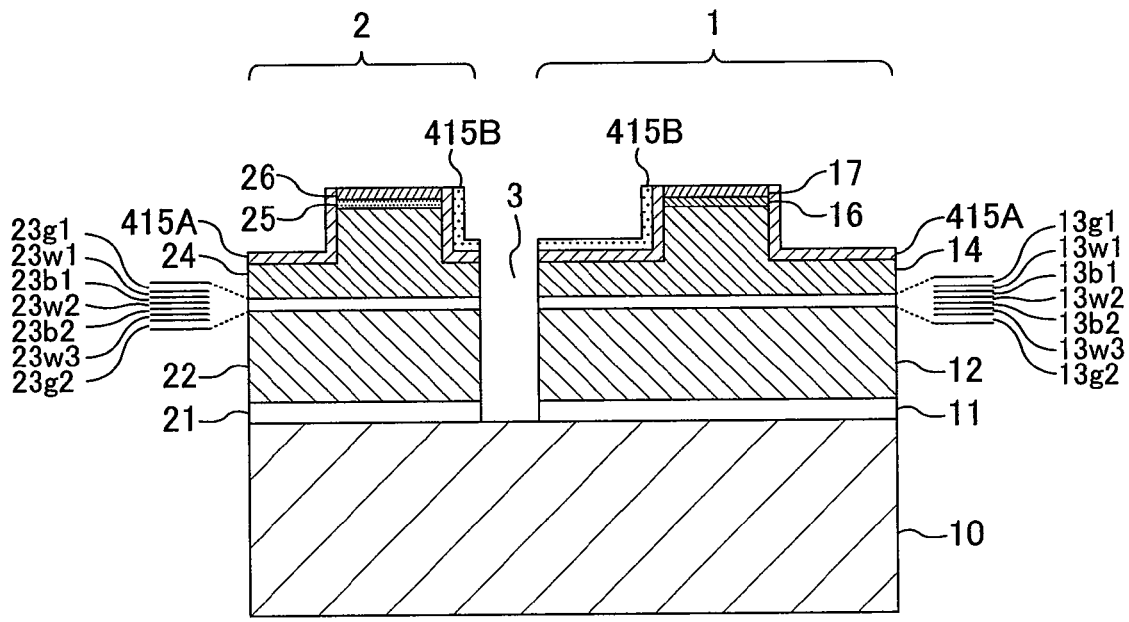
FIG. 11 is a cross-sectional view showing a semiconductor laser device according to a fifth embodiment of the present invention.

FIG. 11 shows a cross-sectional structure of a semiconductor laser device according to the fifth embodiment of the present invention. As shown in FIG. 11, a red laser portion 1 and an infrared laser portion 2 are electrically isolated from each other by an isolation groove 3 and are monolithically integrated on a main surface of a substrate 10. The substrate 10 is made of, for example, n-type GaAs. The center line of the isolation groove 3 is herein displaced by about 10% from the center line in a width direction (the left-right direction in FIG. 11) of a chip toward the infrared laser portion 2. In the fifth embodiment, the chip width is 250 μm, and both light emitting points in the red laser portion 1 and the infrared laser portion 2 have a displacement rate of 20% of the chip width from the center line in the width direction of the chip. Note that the above displacement rate is shown by way of example only, and the red laser portion 1 and the infrared laser portion 2 may have other displacement rates as in the first embodiment.

Each epitaxial layer made of a compound semiconductor in the red laser portion 1 and the infrared laser portion 2 is the same as that in the first embodiment. The epitaxial layers are therefore denoted by the same reference numerals and characters as those of the first embodiment and description thereof will be omitted.

In the fifth embodiment, a current block layer 415A is formed on the p-type cladding layers 14, 24 except the top surface of each ridge portion. A strain relaxing layer 415B is formed only in a region facing the isolation groove 3 on the current block layer 415A. For example, the current block layer 415A is made of zirconium oxide ($ZrO_2$) and has a thickness of 200 nm, and the strain relaxing layer 415B is made of silicon oxide ($SiO_2$) and has a thickness of 50 nm. In the fifth embodiment, the strain relaxing layer 415B is thus formed only on the inner region where the ridge portions face each other.

The p-type cladding layers 14, 24 made of p-type AlGaInP have a thermal expansion coefficient of 4.7 to 6.0, the current block layer 415A made of $ZrO_2$ has a thermal expansion coefficient of 8.0 to 11.5, and the strain relaxing layer 415B made of $SiO_2$ has a thermal expansion coefficient of 0.6 to 0.9. Provided that the respective thermal expansion coefficients of the p-type cladding layers 14, 24, the current block layer 415A, and the strain relaxing layer 415B are denoted by Tc, Tb, and Ts, respectively, it can be seen that the thermal expansion coefficients satisfy the relation of Ts<Tc<Tb.

It is herein assumed that the strain relaxing layer 415B having a large thermal expansion coefficient is formed on the whole surface of the current block layer 415A having a small thermal expansion coefficient, and such a semiconductor laser device is mounted p-side down on a submount functioning as a heat sink having a larger thermal expansion coefficient than that of GaAs, such as copper (Cu). In this case, the semiconductor laser device is concavely curved with respect to the mounting surface of the submount due to the difference in thermal expansion coefficient between the submount and the substrate 10.

A large stress is therefore applied to the outside of the first ridge portion in the red laser portion 1 that is provided away from the center line of the chip toward one side (the right side in the figure). Similarly, a large stress is applied to the outside of the second ridge portion in the infrared laser portion 2 that is provided away from the center line of the chip toward the other side (the left side in the figure). Accordingly, a stress that is applied to the respective ridge portions in the red laser portion 1 and the infrared laser portion 2 becomes left-right asymmetric.

As described above, this left-right asymmetry of the stress causes a shearing stress in semiconductor crystal of the laser device, whereby a refractive index in the crystal changes into a birefringence. This causes rotation of a polarization plane of light traveling in a longitudinal direction of a cavity, degrading the polarization ratio. It is therefore difficult to simultaneously obtain the polarization property in both the red laser portion 1 and the infrared laser portion 2.

In the fifth embodiment, however, the strain relaxing layer 415B having a small thermal expansion coefficient is provided only on the inner side of each ridge portion in the red laser portion 1 and the infrared laser portion 2. Strains therefore cancel each other in the semiconductor material of each ridge portion. This improves the left-right asymmetry of the stress that is applied to the ridge portions in the red laser portion 1 and the infrared laser portion 2 provided left-right symmetrically from the center line of the chip. The polarization property of each laser portion 1, 2 can therefore be improved.

As has been described above, the isolation groove 3 for electrically isolating the red laser portion 1 and the infrared laser portion 2 from each other is provided asymmetrically with respect to the center line in the width direction of the chip, and the strain relaxing layer 415B having a smaller thermal expansion coefficient than that of the current block layer 415A is provided on the inner side of each ridge portion in the red laser portion 1 and the infrared laser portion 2 on the current block layer 415A. With this structure, strains therefore cancel each other in the semiconductor material of each ridge portion. This improves the left-right asymmetry of the stress that is applied to the ridge portions in the red laser portion 1 and the infrared laser portion 2 provided left-right symmetrically from the center line of the chip. As a result, the polarization property in the red laser portion 1 and the infrared laser portion 2 can be improved.

Sixth Embodiment

Hereinafter, a sixth embodiment of the present invention will be described with reference to the drawings.

Figure 12:
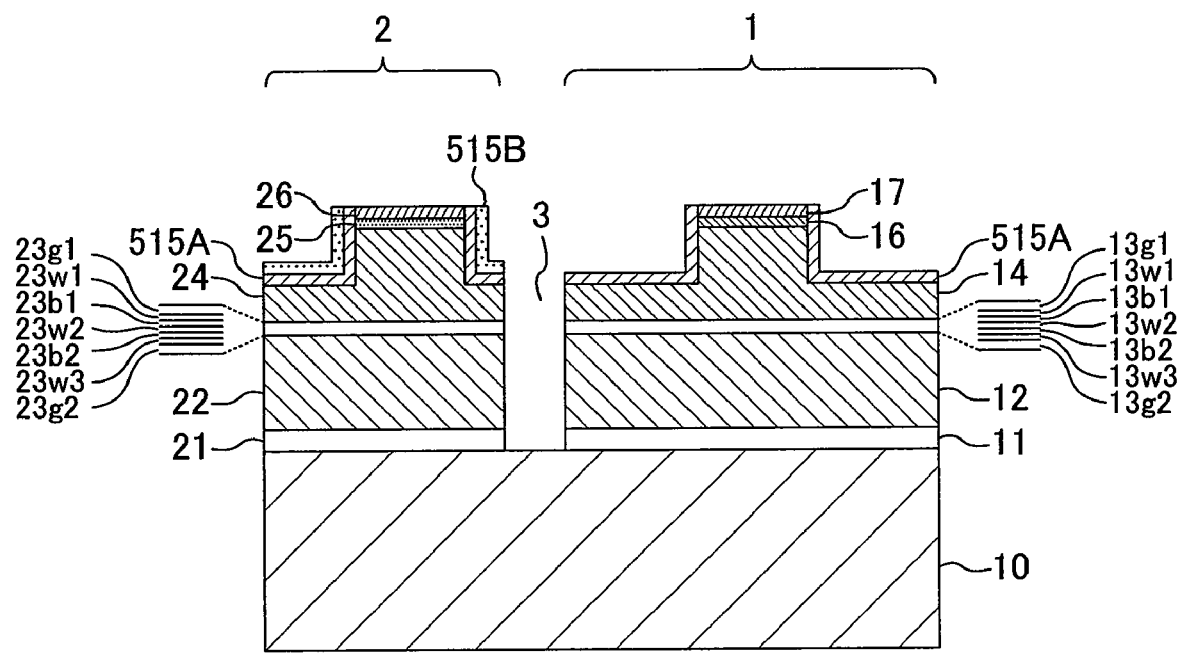
FIG. 12 is a cross-sectional view showing a semiconductor laser device according to a sixth embodiment of the present invention.

FIG. 12 shows a cross-sectional structure of a semiconductor laser device according to the sixth embodiment of the present invention. As shown in FIG. 12, a red laser portion 1 and an infrared laser portion 2 are electrically isolated from each other by an isolation groove 3 and are monolithically integrated on a main surface of a substrate 10. The substrate 10 is made of, for example, n-type GaAs. The center line of the isolation groove 3 is herein displaced by about 10% from the center line in a width direction (the left-right direction in FIG. 12) of a chip toward the infrared laser portion 2. In the sixth embodiment, the chip width is 250 μm, and a light emitting point in the red laser portion 1 has a displacement rate of 10% of the chip width from the center line in the width direction of the chip. Moreover, a light emitting point in the infrared laser portion 2 has a displacement rate of 30% of the chip width from the center line in the width direction of the chip.

Each epitaxial layer made of a compound semiconductor in the red laser portion 1 and the infrared laser portion 2 is the same as that in the first embodiment. The epitaxial layers are therefore denoted by the same reference numerals and characters as those of the first embodiment and description thereof will be omitted.

In the sixth embodiment, a current block layer 515A is formed on the p-type cladding layers 14, 24 except the top surface of each ridge portion. A strain relaxing layer 515B is formed only on the current block layer 515A in the current block layer 415A. For example, the current block layer 515A is made of silicon nitride (SiN) and has a thickness of 200 nm, and the strain relaxing layer 515B is made of zirconium oxide ($ZrO_2$) and has a thickness of 50 nm. In the sixth embodiment, the strain relaxing layer 515B is thus formed only on both sides of the second ridge portion of the infrared laser portion 2.

The p-type cladding layers 14, 24 made of p-type AlGaInP have a thermal expansion coefficient of 4.7 to 6.0, the current block layer 515A made of $SiN_x$ has a thermal expansion coefficient of 2.8 to 3.2, and the strain relaxing layer 515B made of $ZrO_2$ has a thermal expansion coefficient of 8.0 to 11.5. Provided that the respective thermal expansion coefficients of the p-type cladding layers 14, 24, the current block layer 515A, and the strain relaxing layer 515B are denoted by Tc, Tb, and Ts, respectively, it can be seen that the thermal expansion coefficients satisfy the relation of Tb<Tc<Ts.

It is herein assumed that the strain relaxing layer 515B having a large thermal expansion coefficient is formed on the whole surface of the current block layer 515A having a small thermal expansion coefficient in the red laser portion 1 and the infrared laser portion 2, and such a semiconductor laser device is mounted p-side down on a submount functioning as a heat sink having a high thermal conductivity such as aluminum nitride (AlN) or silicon carbide (SiC). In this case, the semiconductor laser device is convexly curved with respect to the mounting surface of the submount due to the difference in thermal expansion coefficient between the submount and the substrate 10.

A large stress is therefore applied to the outside of the first ridge portion in the red laser portion 1 that is provided away from the center line of the chip toward one side (the right side in the figure). Similarly, a large stress is applied to the outside of the second ridge portion in the infrared laser portion 2 that is provided away from the center line of the chip toward the other side (the left side in the figure). Accordingly, a stress that is applied to the respective ridge portions in the red laser portion 1 and the infrared laser portion 2 becomes left-right asymmetric.

As described above, this left-right asymmetry of the stress causes a shearing stress in semiconductor crystal of the laser device, whereby a refractive index in the crystal changes into a birefringence. This causes rotation of a polarization plane of light traveling in a longitudinal direction of a cavity, degrading the polarization ratio. It is therefore difficult to simultaneously obtain the polarization property in both the red laser portion 1 and the infrared laser portion 2.

In the sixth embodiment, however, the strain relaxing layer 515B having a large thermal expansion coefficient is provided only in the infrared laser portion 2 having a large displacement rate as high as 30% of the chip width from the center line of the chip. Strains therefore cancel each other in the semiconductor material of the second ridge portion. This improves the left-right asymmetry of the stress that is applied to the ridge portions in the red laser portion 1 and the infrared laser portion 2 provided left-right asymmetrically from the center line of the chip. The polarization property of each laser portion 1, 2 can therefore be improved. Especially, degradation in polarization property can be prevented in the infrared laser portion 2 that is located far from the center line of the chip.

Note that, in the example shown in the sixth embodiment, the strain relaxing layer 515B made of $ZrO_2$ and having a uniform thickness of 50 nm is formed on both sides of the ridge portion in the infrared laser portion 2. However, a larger stress is applied to the outside (the opposite side to the isolation groove 3) of the second ridge portion in the infrared laser portion 2. It is therefore preferable to vary the thickness of the strain relaxing layer 515B between the inner side (the side facing the isolation groove 3) and outer side of the second ridge portion. For example, in the case where the thickness of the strain relaxing layer 515B is larger (for example, 60 nm) on the outer side of the second ridge portion than on the inner side thereof, the left-right asymmetry of the stress that is applied to the chip can further be improved. This structure therefore has an effect on improvement in polarization property.

As has been described above, the isolation groove 3 for electrically isolating the red laser portion 1 and the infrared laser portion 2 from each other is provided asymmetrically with respect to the center line in the width direction of the chip, and the strain relaxing layer 515B having a larger thermal expansion coefficient than that of the current block layer 515A is provided only on both sides of the second ridge portion in the infrared laser portion 2 on the current block layer 515A. With this structure, strains therefore cancel each other in the semiconductor material of the second ridge portion. This improves the left-right asymmetry of the stress that is applied to the ridge portions in the red laser portion 1 and the infrared laser portion 2 provided left-right asymmetrically from the center line of the chip. As a result, the polarization property in the red laser portion 1 and the infrared laser portion 2 can be improved.

Although embodiments of the present invention have been specifically described, the present invention is not limited to the above embodiments and is capable of various modifications based on the technical idea of the present invention. For example, the numerical values, element structure, substrate, manufacturing process, growth method, and the like described in each embodiment are by way of example only, and different numerical values, element structure, substrate, manufacturing process, growth method, and the like different from those described above may be used as required.

More specifically, although the MOCVD method is herein used as a growth method of the semiconductor crystal layer, other epitaxial growth methods such as a molecular beam epitaxy method may be used.

In the first embodiment, the ranges of $100 \text{ nm} \leq d1 \leq 450$ nm and $10 \text{ nm} \leq d2 \leq 300$ nm are described to be particularly effective for the thickness d1 of the current block layer 15A and the thickness d2 of the strain relaxing layer 15B. However, the respective thicknesses of the current block layer and the strain relaxing layer may also be set to these ranges in other embodiments.

In the first and fourth embodiments, the strain relaxing layer is formed on the outer side of each ridge portion. In the second and fifth embodiments, the strain relaxing layer is formed on the inner sides of the ridge portions. In the third and sixth embodiments, the strain relaxing layer is formed only on both sides of one ridge portion. However, the above embodiments may be combined. For example, the strain relaxing layer may be formed only on the inner side or outer side of one ridge portion and on both sides of the other ridge portion if a large stress is generated in those regions.

As has been described above, the semiconductor laser device of the present invention suppresses generation of crystal defects in the active layer and reduces asymmetry of the stress that is applied to the light emitting portions (ridge stripe portions). Accordingly, reduction in reliability can be prevented and the polarization property can be improved. The semiconductor laser device of the present invention is therefore particularly useful as a semiconductor laser device including a plurality of light emitting points on a single substrate, which is used as a light source of an optical disc device, an electronic device, an information processor, or the like.

What is claimed is:

1. A semiconductor laser device, comprising:
a first semiconductor laser structure and a second semiconductor laser structure formed on a semiconductor substrate with an isolation groove interposed therebetween, the first semiconductor laser structure having a first ridge stripe portion and the second semiconductor laser structure having a second ridge stripe portion extending in parallel with the first ridge stripe portion, wherein
the first semiconductor laser structure has a first cladding layer, a first active layer, a second cladding layer, and a first current block layer which are sequentially formed on the semiconductor substrate,
the second semiconductor laser structure has a third cladding layer, a second active layer, a fourth cladding layer, and a second current block layer which are sequentially formed on the semiconductor substrate with the isolation groove interposed between the first semiconductor laser structure and the second semiconductor laser structure,
a first strain relaxing layer is formed on a side surface of, and on a region located on a side of, the first ridge stripe portion of the second cladding layer on an opposite side to the second semiconductor laser structure,
a second strain relaxing layer is formed on a side surface of, and on a region located on a side of, the second ridge stripe portion of the fourth cladding layer on an opposite side to the first semiconductor laser structure, and
provided that Tc is a thermal expansion coefficient of the second cladding layer and the fourth cladding layer, Tb is a thermal expansion coefficient of the first current block layer and the second current block layer, and Ts is a thermal expansion coefficient of the first strain relaxing layer and the second strain relaxing layer, a relation of $Tb<Tc<Ts$ is satisfied.

2. The semiconductor laser device according to claim 1, wherein the first ridge stripe portion and the second ridge stripe portion are formed symmetrically with respect to a center line of the semiconductor substrate in a width direction perpendicular to an extending direction of the ridge stripe portions.

3. The semiconductor laser device according to claim 1, wherein the first current block layer, the second current block layer, the first strain relaxing layer, and the second strain relaxing layer are made of a material containing silicon nitride, zirconium oxide, aluminum oxide, silicon oxide, or amorphous silicon hydride as a main component.

4. The semiconductor laser device according to claim 1, wherein, provided that d1 is a thickness of the first current block layer and the second current block layer and d2 is a thickness of the first strain relaxing layer and the second strain relaxing layer, $100 \text{ nm} \leq d1 \leq 450$ nm and $10 \text{ nm} \leq d2 \leq 300$ nm.

5. The semiconductor laser device according to claim 1, wherein a center line of the isolation groove in an extending direction thereof matches a center line of the semiconductor substrate in a width direction perpendicular to an extending direction of the ridge stripe portions.

6. The semiconductor laser device according to claim 1, wherein a center line of the isolation groove in an extending direction thereof is shifted in parallel from a center line of the semiconductor substrate in a width direction perpendicular to an extending direction of the ridge stripe portions.

7. The semiconductor laser device according to claim 1, wherein a distance between the first ridge stripe portion and a center line of the semiconductor substrate in a width direction perpendicular to an extending direction of the ridge stripe portions is different from a distance between the second ridge stripe portion and the center line of the semiconductor substrate in the width direction.

8. A semiconductor laser device, comprising:
a first semiconductor laser structure and a second semiconductor laser structure formed on a semiconductor substrate with an isolation groove interposed therebetween, the first semiconductor laser structure having a first ridge stripe portion and the second semiconductor laser structure having a second ridge stripe portion extending in parallel with the first ridge stripe portion, wherein
the first semiconductor laser structure has a first cladding layer, a first active layer, a second cladding layer, and a first current block layer which are sequentially formed on the semiconductor substrate, the second semiconductor laser structure has a third cladding layer, a second active layer, a fourth cladding layer, and a second current block layer which are sequentially formed on the semiconductor substrate with the isolation groove interposed between the first semiconductor laser structure and the second semiconductor laser structure, a first strain relaxing layer is formed on a side surface of, and on a region located on a side of, the first ridge stripe portion of the second cladding layer on a side facing the second semiconductor laser structure, a second strain relaxing layer is formed on a side surface of, and on a region located on a side of, the second ridge stripe portion of the fourth cladding layer on a side facing the first semiconductor laser structure, and provided that Tc is a thermal expansion coefficient of the second cladding layer and the fourth cladding layer, Tb is a thermal expansion coefficient of the first current block layer and the second current block layer, and Ts is a thermal expansion coefficient of the first strain relaxing layer and the second strain relaxing layer, a relation of Ts<Tc<Tb is satisfied.

9. The semiconductor laser device according to claim 8, wherein the first ridge stripe portion and the second ridge stripe portion are formed symmetrically with respect to a center line of the semiconductor substrate in a width direction perpendicular to an extending direction of the ridge stripe portions.

10. The semiconductor laser device according to claim 8, wherein the first current block layer, the second current block layer, the first strain relaxing layer, and the second strain relaxing layer are made of a material containing silicon nitride, zirconium oxide, aluminum oxide, silicon oxide, or amorphous silicon hydride as a main component.

11. The semiconductor laser device according to claim 8, wherein, provided that d1 is a thickness of the first current block layer and the second current block layer and d2 is a thickness of the first strain relaxing layer and the second strain relaxing layer, 100 nm$\leq$d1$\leq$450 nm and 10 nm$\leq$d2$\leq$300 nm.

12. The semiconductor laser device according to claim 8, wherein a center line of the isolation groove in an extending direction thereof matches a center line of the semiconductor substrate in a width direction perpendicular to an extending direction of the ridge stripe portions.

13. The semiconductor laser device according to claim 8, wherein a center line of the isolation groove in an extending direction thereof is shifted in parallel from a center line of the semiconductor substrate in a width direction perpendicular to an extending direction of the ridge stripe portions.

14. The semiconductor laser device according to claim 8, wherein a distance between the first ridge stripe portion and a center line of the semiconductor substrate in a width direction perpendicular to an extending direction of the ridge stripe portions is different from a distance between the second ridge stripe portion and the center line of the semiconductor substrate in the width direction.

15. A semiconductor laser device, comprising:
a first semiconductor laser structure and a second semiconductor laser structure formed on a semiconductor substrate with an isolation groove interposed therebetween, the first semiconductor laser structure having a first ridge stripe portion and the second semiconductor laser structure having a second ridge stripe portion extending in parallel with the first ridge stripe portion, wherein the first semiconductor laser structure has a first cladding layer, a first active layer, a second cladding layer, and a first current block layer which are sequentially formed on the semiconductor substrate, the second semiconductor laser structure has a third cladding layer, a second active layer, a fourth cladding layer, and a second current block layer which are sequentially formed on the semiconductor substrate with the isolation groove interposed between the first semiconductor laser structure and the second semiconductor laser structure, a strain relaxing layer is formed on both side surfaces of, and on a region on both sides of, the first ridge stripe portion of the second cladding layer, and provided that Tc is a thermal expansion coefficient of the second cladding layer, Tb is a thermal expansion coefficient of the first current block layer, and Ts is a thermal expansion coefficient of the strain relaxing layer, a relation of Tb<Tc<Ts is satisfied.

16. The semiconductor laser device according to claim 15, wherein a center line of the isolation groove in an extending direction thereof matches a center line of the semiconductor substrate in a width direction perpendicular to an extending direction of the ridge stripe portions.

17. The semiconductor laser device according to claim 15, wherein a center line of the isolation groove in an extending direction thereof is shifted in parallel from a center line of the semiconductor substrate in a width direction perpendicular to an extending direction of the ridge stripe portions.

18. The semiconductor laser device according to claim 15, wherein a distance between the first ridge stripe portion and a center line of the semiconductor substrate in a width direction perpendicular to an extending direction of the ridge stripe portions is different from a distance between the second ridge stripe portion and the center line of the semiconductor substrate in the width direction.

19. The semiconductor laser device according to claim 15, wherein a distance between the first ridge stripe portion and a center line of the semiconductor substrate in a width direction perpendicular to an extending direction of the ridge stripe portions is larger than a distance between the second ridge stripe portion and the center line of the semiconductor substrate in the width direction.

20. The semiconductor laser device according to claim 15, wherein the first current block layer and the strain relaxing layer are made of a material containing silicon nitride, zirconium oxide, aluminum oxide, silicon oxide, or amorphous silicon hydride as a main component.

21. The semiconductor laser device according to claim 15, wherein, provided that d1 is a thickness of the first current block layer and d2 is a thickness of the strain relaxing layer, 100 nm$\leq$d1$\leq$450 nm and 10 nm$\leq$d2$\leq$300 nm.

* * * * *